United States Patent
Dyer et al.

(10) Patent No.: US 7,666,721 B2
(45) Date of Patent: Feb. 23, 2010

(54) SOI SUBSTRATES AND SOI DEVICES, AND METHODS FOR FORMING THE SAME

(75) Inventors: Thomas W. Dyer, Pleasant Valley, NY (US); Zhijiong Luo, Carmel, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 11/308,292

(22) Filed: Mar. 15, 2006

(65) Prior Publication Data
US 2007/0218603 A1  Sep. 20, 2007

(51) Int. Cl.
*H01L 21/00* (2006.01)
(52) U.S. Cl. .................. 438/153; 438/407; 438/480; 257/E21.563
(58) Field of Classification Search ............ 438/153, 438/407, 480, 967; 257/E21.561, E21.563, 257/E21.628, E21.642
See application file for complete search history.

(56) References Cited

U.S. PATENT DOCUMENTS

| | | | |
|---|---|---|---|
| 5,494,846 A | 2/1996 | Yamazaki | |
| 5,702,957 A * | 12/1997 | Padmanabhan | 438/262 |
| 5,712,173 A | 1/1998 | Liu et al. | |
| 5,930,642 A * | 7/1999 | Moore et al. | 438/407 |
| 5,963,798 A | 10/1999 | Kim et al. | |
| 6,063,652 A | 5/2000 | Kim | |
| 6,069,054 A * | 5/2000 | Choi | 438/423 |
| 6,255,145 B1 | 7/2001 | Ajmera et al. | |
| 6,281,593 B1 | 8/2001 | Brown et al. | |
| 6,287,901 B1 | 9/2001 | Christensen et al. | |
| 6,294,817 B1 | 9/2001 | Srinivasan et al. | |

(Continued)

FOREIGN PATENT DOCUMENTS

CN  1379464  11/2002

(Continued)

OTHER PUBLICATIONS

Stanley Wolf, Silicon Processing For the VLSI Era, 1990, vol. II, pp. 66-67.*

*Primary Examiner*—Charles D Garber
*Assistant Examiner*—Stanetta D Isaac
(74) *Attorney, Agent, or Firm*—Scully, Scott, Murphy & Presser, P.C.; H. Daniel Schnurmann

(57) ABSTRACT

An improved semiconductor-on-insulator (SOI) substrate is provided, which contains a patterned buried insulator layer at varying depths. Specifically, the SOI substrate has a substantially planar upper surface and comprises: (1) first regions that do not contain any buried insulator, (2) second regions that contain first portions of the patterned buried insulator layer at a first depth (i.e., measured from the planar upper surface of the SOI substrate), and (3) third regions that contain second portions of the patterned buried insulator layer at a second depth, where the first depth is larger than the second depth. One or more field effect transistors (FETs) can be formed in the SOI substrate. For example, the FETs may comprise: channel regions in the first regions of the SOI substrate, source and drain regions in the second regions of the SOI substrate, and source/drain extension regions in the third regions of the SOI substrate.

14 Claims, 18 Drawing Sheets

U.S. PATENT DOCUMENTS

| | | |
|---|---|---|
| 6,333,532 B1 | 12/2001 | Davari et al. |
| 6,380,037 B1 | 4/2002 | Osanai |
| 6,429,099 B1 | 8/2002 | Christensen et al. |
| 6,465,852 B1 | 10/2002 | Ju |
| 6,472,753 B2 | 10/2002 | Kondo et al. |
| 6,475,868 B1 * | 11/2002 | Hao et al. .................. 438/301 |
| 6,531,741 B1 * | 3/2003 | Hargrove et al. ............ 257/350 |
| 6,958,282 B1 * | 10/2005 | Huttner et al. .............. 438/407 |
| 7,250,351 B2 * | 7/2007 | Furukawa et al. ........... 438/423 |
| 7,323,373 B2 * | 1/2008 | Mathew et al. .............. 438/156 |
| 2001/0020722 A1 * | 9/2001 | Yang .......................... 257/347 |
| 2004/0195626 A1 | 10/2004 | Yamada et al. |
| 2005/0242397 A1 | 11/2005 | Nagano et al. |
| 2006/0231892 A1 * | 10/2006 | Furukawa et al. ........... 257/347 |
| 2006/0234428 A1 * | 10/2006 | Furukawa et al. ........... 438/149 |
| 2007/0172996 A1 * | 7/2007 | Mathew et al. .............. 438/142 |

FOREIGN PATENT DOCUMENTS

JP          409064323 A          3/1997

\* cited by examiner

SOI SUBSTRATES AND SOI DEVICES, AND METHODS FOR FORMING THE SAME

FIELD OF THE INVENTION

The present invention generally relates to improved semiconductor-on-insulator (SOI) substrates and SOI devices, and methods for forming such SOI substrates and SOI devices. More specifically, the present invention relates to SOI substrates that contain patterned buried insulator layers at varying depths, and SOI devices that are formed in such SOI substrates with the patterned buried insulator layers self-aligned to the SOI device junctions.

BACKGROUND OF THE INVENTION

Semiconductor-on-insulator (SOI) technology is becoming increasingly important in semiconductor processing. A SOI substrate structure typically contains a buried insulator layer, which functions to electrically isolate a top semiconductor layer from a bottom semiconductor substrate. Active devices, such as transistors, are typically formed in the top semiconductor layer of the SOI substrate.

Devices formed using SOI technology (i.e., SOI devices) offer many advantages over their bulk counterparts, including, but not limited to: reduction of junction leakage, reduction of junction capacitance, reduction of short channel effects, better device performance, higher packing density, and lower voltage requirements.

However, a charge can build up in the body of the SOI devices, which in turn leads to undesirable floating body effects that adversely impact the device performance. Further, as the SOI devices are scaled down, the contact resistance in the SOI devices is significantly increased. In order to reduce the contact resistance, raised source and/or drain structures are typically employed in ultra-thin SOI devices, which increases the manufacturing costs as well as the defect density of the SOI devices.

There is therefore a need for improved SOI substrates and SOI devices with reduced floating body effects and reduced contact resistance. There is also a need for a simple and effective method of fabricating the improved SOI substrates and SOI devices at reduced costs with fewer defects.

SUMMARY OF THE INVENTION

The present invention solves the above-described problems of conventional SOI structures by providing improved SOI substrates comprising patterned buried insulator layers located at varying depths of such SOI substrates. Further, improved SOI devices can be formed in such SOI substrates with the patterned buried insulator layers self-aligned to the SOI device junctions in such a manner as to reduce the floating body effects and the contact resistance, but without increasing the junction leakage and the junction capacitance.

In one aspect, the present invention relates to a semiconductor-on-insulator (SOI) substrate having a substantially planar upper surface with a patterned buried insulator layer located therein, wherein the SOI substrate comprises first regions that do not contain any buried insulator, second regions that contain first portions of the patterned buried insulator layer at a first depth from the substantially planar upper surface, and third regions that contain second portions of the patterned buried insulator layer at a second depth from the substantially planar upper surface, and wherein the first depth is larger than the second depth.

Preferably, the first depth ranges from about 20 nm to about 200 nm, and the second depth ranges from about 10 nm to about 100 nm.

The first portions of the patterned buried insulator layer may have an average thickness that is either substantially the same as, or smaller/larger than, that of the second portions of the patterned buried insulator layer.

When the first portions of the patterned buried insulator layer have an average thickness that is substantially the same as that of the second portions of the patterned buried insulator layer, it is preferred that both the first and second portions of the patterned buried insulator layer have an average thickness ranging from about 10 nm to about 200 nm.

Alternatively, when the first portions of the patterned buried insulator layer have an average thickness that is smaller than that of the second portions of the patterned buried insulator layer, it is preferred that the first portions of the patterned buried insulator layer have an average thickness ranging from about 10 nm to about 200 nm, and the second portions of the patterned buried insulator layer have an average thickness ranging from about 20 nm to about 400 nm.

Further, when the first portions of the patterned buried insulator layer have an average thickness that is larger than that of the second portions of the patterned buried insulator layer, it is preferred that the first portions of the patterned buried insulator layer have an average thickness ranging from about 20 nm to about 400 nm, and the second portions of the patterned buried insulator layer have an average thickness ranging from about 10 nm to about 200 nm.

In another aspect, the present invention relates to a semiconductor device that comprises one or more field effect transistors (FETs). Specifically, the one or more FETs comprise: (1) one or more channel regions located in a semiconductor-on-insulator (SOI) substrate that has a substantially planar upper surface, wherein the channel regions do not contain any buried insulator, (2) source and drain regions located in the SOI substrate on opposite sides of the one or more channel regions, wherein the source and drain regions contain first portions of a patterned buried insulator layer at a first depth from the substantially planar upper surface of the SOI substrate, and (3) source and drain extension regions located in the SOI substrate between the channel regions and the source and drain regions, respectively, wherein the source and drain extension regions contain second portions of the patterned buried insulator layer at a second depth from the substantially planar upper surface of the SOI substrate, and wherein the first depth is larger than the second depth.

In this manner, the patterned buried insulator layer of the SOI substrate is self-aligned to the channel regions, source/drain regions, and source/drain extension regions of the one or more FETs, so as to reduce the floating body effects and the source/drain contact resistance, but without increasing the junction leakage and the junction capacitance in the FETs.

In still another aspect, the present invention relates to a method for forming a semiconductor-on-insulator (SOI) substrate, which comprises:

forming a semiconductor substrate having a substantially planar upper surface with predetermined first, second, and third regions;

conducting one or more ion implantation steps to selectively implant oxygen and/or nitrogen ions into the second and third regions, but not the first regions, of the semiconductor substrate; and conducting one or more annealing steps to convert the implanted oxygen and/or nitrogen ions into buried insulator, wherein the first regions of the semiconductor substrate do not contain any buried insulator, wherein the second regions of the semiconductor substrate contain first portions of a patterned buried insulator layer at a first depth from the substantially planar upper surface, wherein the third regions of the semiconductor substrate contain second portions of the patterned buried insulator layer at a second depth from the substantially planar upper surface, and wherein the first depth is larger than the second depth.

In a specific embodiment of the present invention, a single ion implantation step is employed for implanting oxygen and/or nitrogen ions into the second and third regions, but not the first regions, of the semiconductor substrate. Preferably, the first regions of the semiconductor substrate are covered during the single ion implantation step by first masking structures that are sufficient to completely block implantation of oxygen and/or nitrogen ions in the first regions. The second regions of the semiconductor substrate are exposed during the single ion implantation step so that oxygen and/or nitrogen ions are implanted into the second regions at the first depth. The third regions of the semiconductor substrate are covered during the single ion implantation step by second masking structures that are sufficient to reduce implantation depth of oxygen and/or nitrogen ions in the third regions to the second depth.

More specifically, the first masking structures may comprise either dielectric block masks or gate conductors with dielectric block masks located thereover. The second masking structures may comprise either dielectric spacers that are formed by a deposition and etching process or oxide masks that are formed by a high-density plasma (HDP) process.

In an alternative embodiment of the present invention, at least a first and a second ion implantation steps are employed to implant oxygen and/or nitrogen ions into the second and third regions of the semiconductor substrate. Preferably, but not necessarily, the first ion implantation step implants oxygen and/or nitrogen ions at the first depth from the substantially planar upper surface of the semiconductor substrate, and the second implantation step implants oxygen and/or nitrogen ions at the second depth from the substantially planar upper surface of the semiconductor substrate. During both the first and second ion implantation steps, the first regions of the semiconductor substrate are covered, so that no oxygen and/or nitrogen ions are implanted in the first regions. The second regions of the semiconductor substrate are implanted with oxygen and/or nitrogen ions only during the first ion implantation step so that ion implantation depth in the second regions is equal to the first, larger depth. The third regions of the semiconductor substrate are implanted with oxygen and/or nitrogen ions either only during the second ion implantation step, or during both the first and second ion implantation steps, so that the final ion implantation depth in the third regions is equal to the second, smaller depth.

In a further alternative embodiment of the present invention, multiple ion implantation and multiple annealing steps are employed in order to form a high quality patterned buried insulator layer as described hereinabove.

In yet another aspect, the present invention relates to a method for fabricating a semiconductor device, which comprises:

forming a semiconductor-on-insulator (SOI) substrate having a substantially planar upper surface with a patterned buried insulator layer located therein, wherein the SOI substrate comprises first regions that do not contain any buried insulator, second regions that contain first portions of the patterned buried insulator layer at a first depth from the substantially planar upper surface, and third regions that contain second portions of the patterned buried insulator layer at a second depth from the substantially planar upper surface, and wherein the first depth is larger than the second depth; and forming one or more field effect transistors (FETs), which comprise: (1) one or more channel regions located in the first regions of the SOI substrate, (3) source and drain regions located in the second regions of the SOI substrate, and (4) source and drain extension regions located in the third regions of the SOI substrate.

Other aspects, features and advantages of the invention will be more fully apparent from the ensuing disclosure and appended claims.

DETAILED DESCRIPTION OF THE INVENTION

Figure 1:
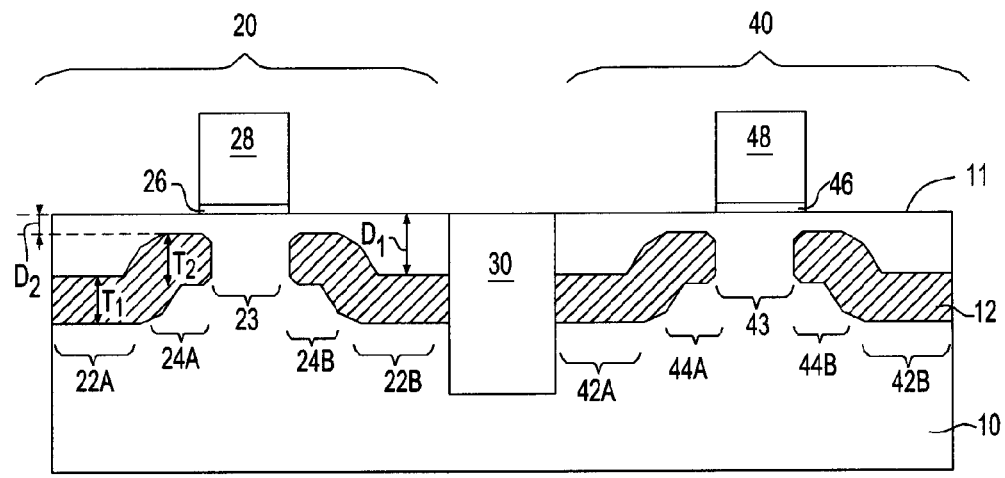
FIG. 1 shows a cross-sectional view of an exemplary SOI device containing two FETs with a patterned buried insulator layer that has substantially the same average thickness in the source and drain (S/D) regions of the FETs and the S/D extension regions of the FETs, according to one embodiment of the present invention.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The term "patterned" as used herein refers to the discontinuity of a layered structure. For example, a patterned buried insulator layer is discontinuous in the SOI substrate, i.e., it extends to certain regions of the SOI substrate, but is completely absent in other regions of the SOI substrate.

The term "substantially planar" as used herein refers to the smoothness of a surface defined by surface protrusions or depressions of less than about 10 nm in height or depth.

The term "depth" as used in association with the patterned buried insulator layer (or portions thereof) refers to the average distance between an upper surface of the patterned buried insulator layer (or portions thereof) and an upper surface of the substrate in which the patterned buried insulator layer is located.

The term "thickness" as used herein refers to the average thickness of a layer or similar structure.

The term "substantially the same" as used herein refers to a parameter variation of not more than ±10%.

The present invention provides improved SOI substrates that comprise patterned buried insulator layers located at varying depths of such SOI substrates. Specifically, each of the SOI substrates of the present invention has a substantially planar upper surface and comprises: (1) first regions that do not contain any buried insulator, (2) second regions that contain first portions of the patterned buried insulator layer at a first depth (i.e., measured from the planar upper surface of the SOI substrate), and (3) third regions that contain second portions of the patterned buried insulator layer at a second depth, where the first depth is larger than the second depth.

The present invention also provides improved SOI devices, which are formed in the above-described SOI substrates. Specifically, the patterned buried insulator layers are self-aligned to the SOI device junctions in such a manner as to reduce the floating body effects and the contact resistance, but without increasing the junction leakage and the junction capacitance.

FIG. 1 shows a cross-sectional view of an exemplary SOI device, which contains two FETs 20 and 40 located in a SOI substrate 10.

The SOI substrate 10 may comprise any semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, it is preferred that the SOI substrate 10 be composed of a Si-containing semiconductor material, i.e., a semiconductor material that includes silicon. Further, the SOI substrate 10 may be doped, undoped, or contain both doped and undoped regions therein (not shown).

The SOI substrate 10 has a substantially planar upper surface 11, and it contains a patterned (i.e., discontinuous) buried insulator layer 12 therein. The patterned buried insulator layer 12 may comprise any suitable insulator material(s), and it typically comprises an oxide, a nitride, or an oxynitride in either a crystalline phase or a non-crystalline phase.

The patterned buried insulator layer 12 extends only to certain regions (e.g., regions 22A, 22B, 24A, 24B, 42A, 42B, 44A, and 44B) of the SOI substrate 10, but is completely absent from other regions (e.g., regions 23 and 43) of the SOI substrate 10, as shown in FIG. 1.

Further, the patterned buried insulator layer 12 has different portions that are located in different regions of the SOI substrate 10 at varying depths. For example, certain portions of the patterned buried insulator layer 12 are located in regions 22A, 22B, 42A, and 42B of the SOI substrate 10 at a first depth ($D_1$), as measured from an upper surface 11 of the substrate 10. Other portions of the patterned buried insulator layer 12 are located in regions 24A, 24B, 44A, and 44B of the SOI substrate 10 at a second depth ($D_2$), also measured from the upper surface 11. The first depth ($D_1$) is larger than the second depth ($D_2$), as shown in FIG. 1. Preferably, the first depth ($D_1$) ranges from about 20 nm to about 200 nm, and the second depth ($D_2$) ranges from about 10 nm to about 100 nm. More preferably, the first depth ($D_1$) ranges from about 50 nm to about 100 nm, and the second depth ($D_2$) ranges from about 10 nm to about 20 nm.

One or more isolation regions 30 are typically formed in the SOI substrate 10 to provide isolation between adjacent FETs 20 and 40. The isolation regions 30 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process.

The FETs 20 and 40 can both be n-channel FETs or p-channel FETs. Alternatively, one of 20 and 40 is an n-channel FET, while the other is a p-channel FET. The FETs 20 and 40 comprise at least channel regions 23 and 43, S/D regions 22A, 22B, 42A, and 42B, and S/D extension regions 24A, 24B, 44A, and 44B, which are all located in the SOI substrate 10, as shown in FIG. 1. Specifically, channel regions 23 and 43 do not contain any buried insulator. The S/D regions 22A, 22B, 42A, and 42B contain first portions of the patterned buried insulator layer 12 at the first depth $D_1$. The S/D extension regions 24A, 24B, 44A, and 44B contain second portions of the patterned buried insulator layer 12 at the second depth $D_2$. As mentioned hereinabove, $D_1$ is larger than $D_2$. The FETs 20 and 40 further comprise gate dielectrics 26 and 46, gate electrodes 28 and 48, and one or more optional sidewall spacers (not shown).

Typically, the first portions of the patterned buried insulator layer 12 located in the S/D regions 22A, 22B, 42A, and 42B has an average thickness of $T_1$, and the second portions of the patterned buried insulator layer 12 located in the S/D extension regions 24A, 24B, 44A, and 44B has an average thickness of $T_2$. $T_1$ can be substantially the same as $T_2$, as shown in FIG. 1. Alternatively, $T_1$ can be either larger or smaller than $T_2$, as shown in FIGS. 2 and 3.

Specifically, when $T_1$ is substantially the same as $T_2$, as shown in FIG. 1, it is preferred that $T_1$ and $T_2$ both range from about 10 nm to about 200 nm. When $T_1$ is larger than $T_2$, as shown in FIG. 2, it is preferred that $T_1$ ranges from about 20 nm to about 400 nm, and $T_2$ ranges from about 10 nm to about 200 nm. Further, when $T_1$ is smaller than $T_2$, as shown in FIG.

3, it is preferred that $T_1$ ranges from about 10 nm to about 200 nm, and $T_2$ ranges from about 20 nm to about 400 nm.

Figure 2:
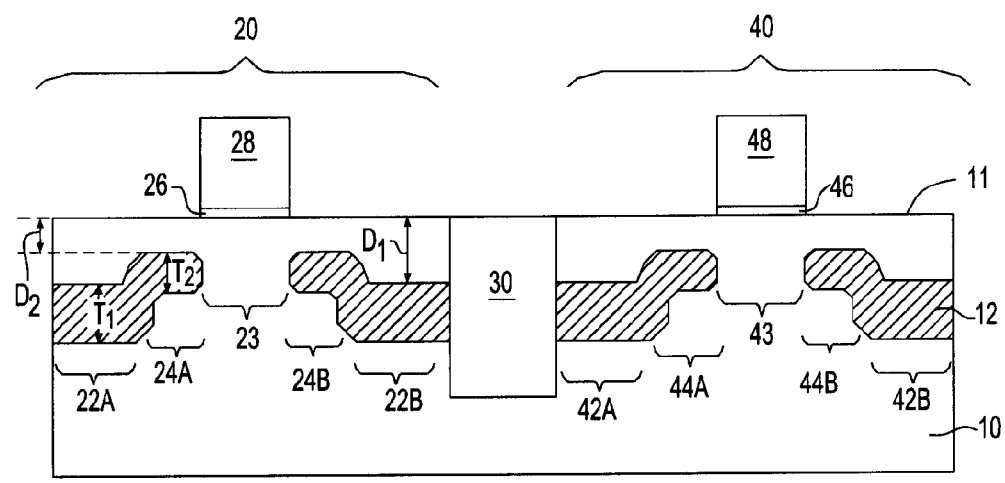
FIG. 2 shows a cross-sectional view of an exemplary SOI device containing two FETs with a patterned buried insulator layer that has a larger average thickness in the S/D regions of the FETs than in the S/D extension regions of the FETs, according to one embodiment of the present invention.
Figure 3:
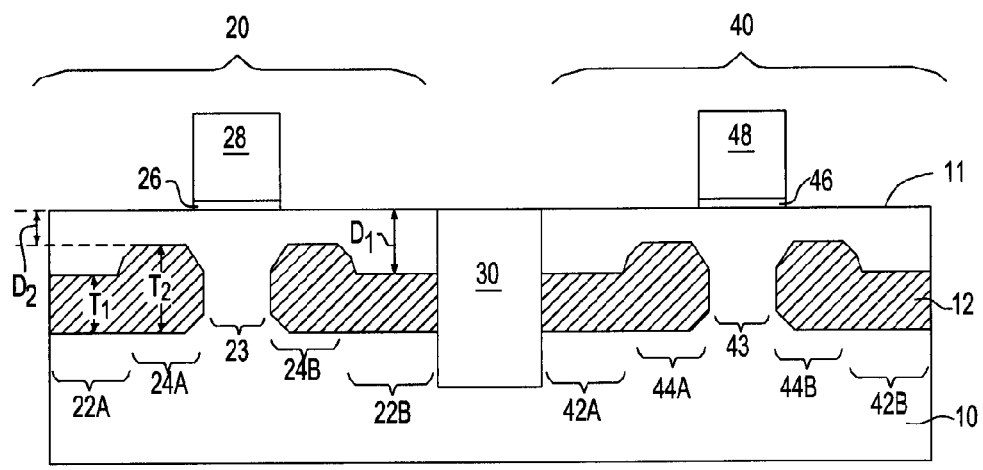
FIG. 3 shows a cross-sectional view of an exemplary SOI device containing two FETs with a patterned buried insulator layer that has a smaller average thickness in the S/D regions of the FETs than in the S/D extension regions of the FETs, according to one embodiment of the present invention.

Note that while FIGS. 1-3 illustratively demonstrate exemplary SOI substrates and SOI devices according to specific embodiments of the present invention, it is clear that a person ordinarily skilled in the art can readily modify such substrate and device structures for adaptation to specific application requirements, consistent with the above descriptions. For example, although the exemplary SOI devices as shown in FIGS. 1-3 each contains two FETs, it is readily understood that the SOI devices may comprise any number of FETs. For another example, although the patterned buried insulator layers as shown in FIGS. 1-3 are located at only two different depths in the SOI substrates, it is understood that such patterned buried insulator layers may be located at more than two different depths in the SOI substrates. Further, the SOI substrates of the present invention can be readily used for forming other semiconductor devices, such as transistors, diodes, capacitors, resistors, inductors, etc., besides the FETs as shown in FIGS. 1-3.

The present invention provides not only improved SOI substrate and device structures as described hereinabove, but also various improved methods for forming such SOI substrate and device structures at reduced costs with less defects. Such methods will be illustrated in greater details hereinafter with reference to FIGS. 4A-8G.

Specifically, FIGS. 4A-4G show exemplary processing steps for forming the SOI device of FIG. 1 by using a single ion implantation step and a replacement gate step, according to one embodiment of the present invention.

Figure 4A:
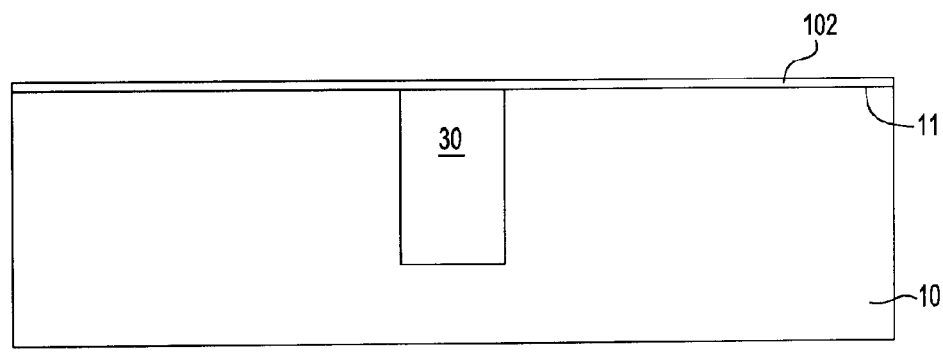
FIGS. 4A-4G show exemplary processing steps for forming the SOI device of FIG. 1 by using a single ion implantation step and a replacement gate step, according to one embodiment of the present invention.

A substrate 10, which is either a bulk semiconductor substrate containing no buried insulator material or a SOI substrate containing one or more preformed buried insulator layers (not shown), is first provided. The substrate 10 has a substantially planar upper surface 11 and one or more isolation regions 30 located therein, as shown in FIG. 4A.

Further, a thin dielectric layer 102 is formed over the upper surface 11 of the substrate 10. The thin dielectric layer 102 may comprise any suitable dielectric material(s), including, but not limited to: oxides, nitrides, and oxynitrides, and it can be formed by a thermal growth process such as, for example, oxidation, nitridation or oxynitridation. Alternatively, the thin dielectric layer 102 can be formed by a deposition process such as, for example, chemical vapor deposition (CVD), plasma-assisted CVD, atomic layer deposition (ALD), evaporation, reactive sputtering, chemical solution deposition and other like deposition processes. In a particularly preferred embodiment of the present invention, the thin dielectric layer 102 comprises an oxide. The physical thickness of the thin dielectric layer 102 may vary, but typically, it has a thickness from about 0.5 to about 10 nm, with a thickness from about 0.5 to about 3 nm being more typical.

Figure 4B:
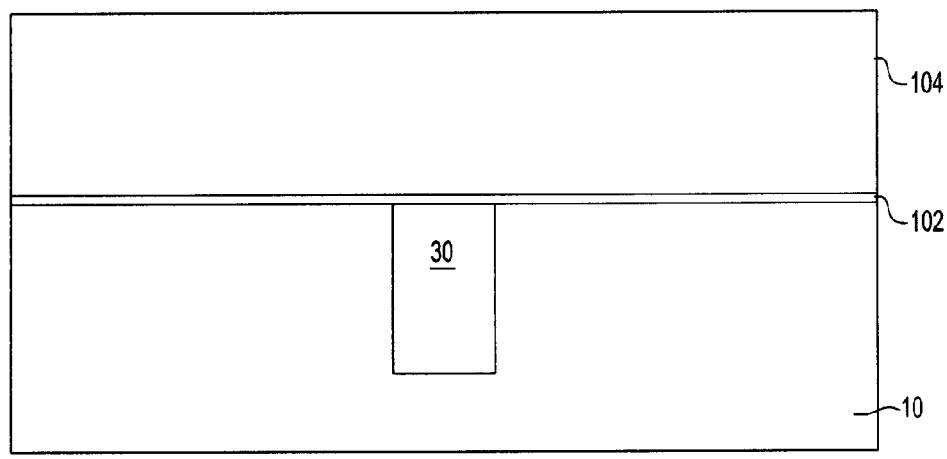

Next, a blanket dielectric mask layer 104 is formed over the thin dielectric layer 102, as shown in FIG. 4B. The blanket dielectric mask layer 104 may comprise any suitable dielectric masking material(s), including, but not limited to: oxides, nitrides, and oxynitrides. Preferably, but not necessarily, the blanket dielectric mask layer 104 comprises silicon nitride. The blanket dielectric mask layer 104 may be formed by any conventional deposition process, including, but not limited to: chemical vapor deposition (CVD), plasma-enhanced CVD, sputtering, evaporation, chemical solution deposition, and other like deposition processes. Alternatively, it may be formed by a conventional thermal oxidation, nitridation or oxynitridation process.

The physical thickness of the blanket dielectric mask layer 104 is adjusted so as to completely block implantation of oxygen and/or nitrogen ions in subsequent ion implantation step(s), and it therefore depends on the specific energy level of the implanted ions (which determines the ion implantation depth under normal conditions, i.e., when no masking structure is provided). Typically, the blanket dielectric mask layer 104 has a thickness ranging from about 100 nm to about 2000 nm, and more typically from about 400 nm to about 1200 nm.

Figure 4C:
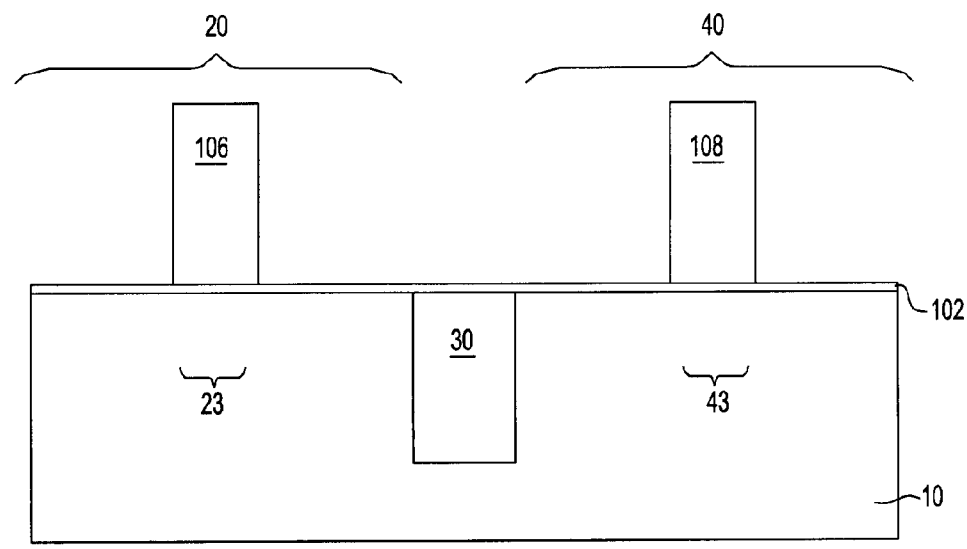

Next, the blanket dielectric mask layer 104 is patterned into dielectric masks 106 and 108, one for the FET 20 and the other for the FET 40, as shown in FIG. 4C. The patterned dielectric masks 106 and 108 specifically define channel regions 23 and 43 for the FETs 20 and 40. The processes that can be used for patterning the blanket dielectric mask layer 104 are well known in the art and are therefore not described in detail here. Preferably, the blanket dielectric mask layer 104 is patterned by conventional processes such as lithography or RIE.

Figure 4D:
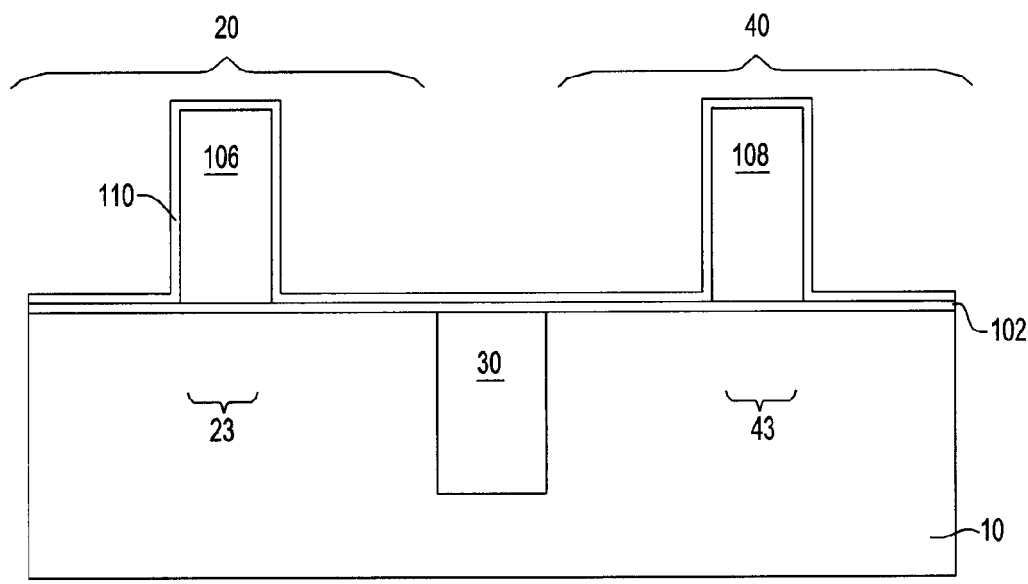

A selectively etchable layer 110 is subsequently formed over the entire structure, as shown in FIG. 4D. The selectively etchable layer 110 may comprise any suitable dielectric material, which includes, but is not limited to: oxide, nitride, and oxynitride, as long as such a dielectric material is different from that contained by the dielectric masks 106 and 108. In this manner, the selectively etchable layer 110 can be selectively etched against the dielectric masks 106 and 108. When the dielectric masks 106 and 108 comprise silicon nitride, it is preferred that the selectively etchable layer 110 comprises silicon oxide ($SiO_2$) or silicon oxynitride ($SiO_xN_y$) that is formed by a chemical vapor deposition. The material is chosen such that it acts as an etch stop for the subsequent nitride spacer.

Figure 4E:
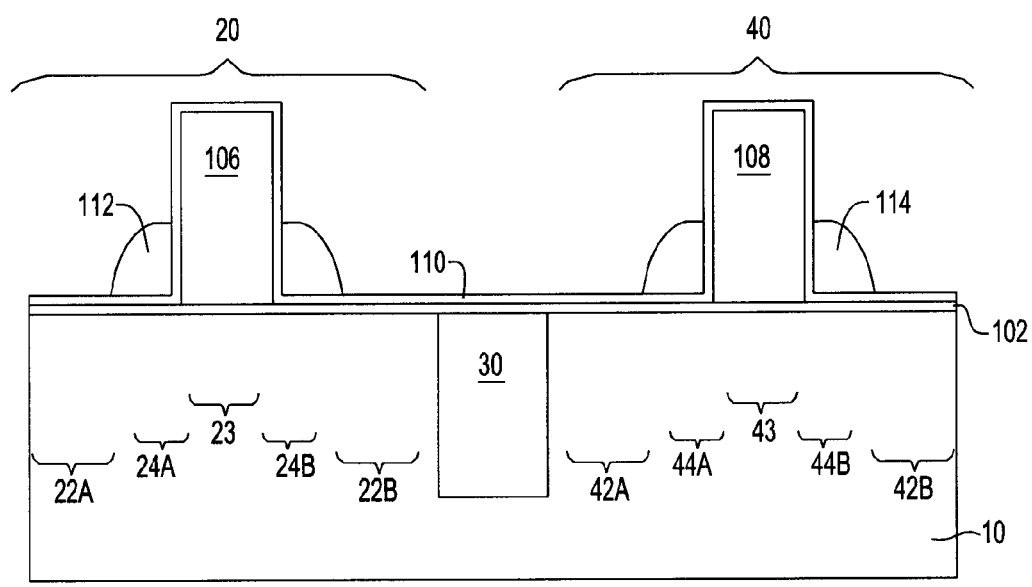

Subsequently, dielectric spacers 112 and 114 are formed along sidewalls of the patterned dielectric masks 106 and 108, thereby defining S/D extension regions 24A, 24B, 44A, and 44B (which are regions located directly under the dielectric spacers 112 and 114) as well as S/D regions 22A, 22B, 42A, and 42B (which are regions located neither under the spacers 112 and 114 nor under the dielectric masks 106 and 108), as shown in FIG. 4E.

The dielectric spacers 112 and 114 may comprise any suitable dielectric material(s), including, but not limited to: oxides, nitrides, and oxynitrides. Preferably, but not necessarily, the dielectric spacers 112 and 114 comprise silicon nitride. Dielectric spacers 112 and 114 can be readily formed by a dielectric deposition step followed by a dielectric patterning step. Preferably, the dielectric patterning is carried out using dry etching techniques, such as reactive ion etching (RIE).

The average thickness of the dielectric spacers 112 and 114 is adjusted in order to reduce the implantation depth of oxygen and/or nitrogen ions in subsequent ion implantation step(s) from the normal ion implantation depth ($D_1$) to a predetermined, reduced depth ($D_2$). Therefore, the average thickness of the dielectric spacers 112 and 114 depends not only on the specific energy level of the implanted ions (which determines the normal ion implantation depth $D_1$), but also on the predetermined, reduced depth $D_2$. Typically, the dielectric spacers 112 and 114 have an average thickness ranging from about 10 nm to about 200 nm, and more typically from about 20 nm to about 100 nm.

Figure 4F:
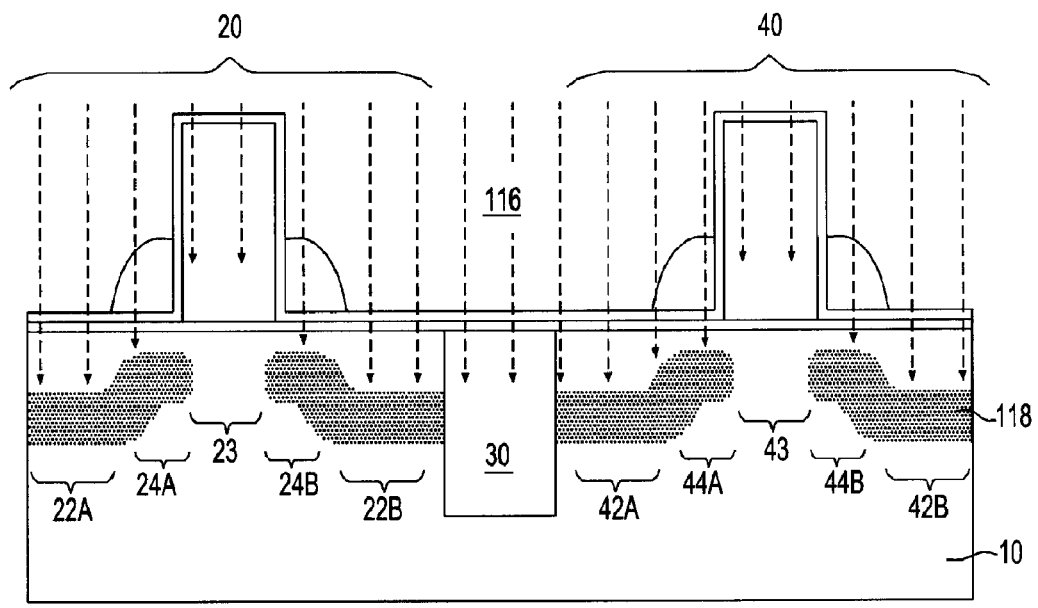

After formation of the dielectric spacers 112 and 114, a single ion implantation step is carried out to implant oxygen and/or nitrogen ions 116 into the S/D regions 22A, 22B, 42A, and 42B and the S/D extension regions 24A, 24B, 44A, and 44B, but not the channel regions 23 and 33, as shown in FIG. 4F. Consequently, a discontinuous implanted ion layer 118, which extends only to the S/D regions 22A, 22B, 42A, and 42B and the S/D extension regions 24A, 24B, 44A, and 44B, is formed in the substrate 10.

During the single ion implantation step shown by FIG. 4F, the S/D regions 22A, 22B, 42A, and 42B are exposed without any masking structures thereon. Therefore, oxygen and/or nitrogen ions 116 are implanted into the S/D regions 22A, 22B, 42A, and 42B without obstruction, and the portions of the implanted ion layer 118 in the S/D regions 22A, 22B, 42A, and 42B are located at a first depth ($D_1$) that are determined solely by the ion implantation energy level. The S/D extension regions 24A, 24B, 44A, and 44B are covered by the dielectric spacers 112 and 114. Therefore, the implantation depth of oxygen and/or nitrogen ions 116 is significantly reduced in the S/D extension regions 24A, 24B, 44A, and 44B, and consequently, the portions of the implanted ion layer 118 in the S/D extension regions 24A, 24B, 44A, and 44B are located at a second, reduced depth ($D_2$). The channel regions 23 and 43 are covered by the dielectric masks 106 and 108 during the single implantation step of FIG. 4F. Therefore, implantation of oxygen and/or nitrogen ions 116 is completely blocked by the dielectric masks 106 and 108 over the channel regions 23 and 43, and consequently, the implanted ion layer 118 does not extend to the channel regions 23 and 43. Note that $D_1$ and $D_2$ as discussed in this specific embodiment are the same as those shown previously in FIG. 1.

The varying depths of the implanted ion layer 118 are, on one hand, achieved by adjusting the implantation energy level, the thicknesses of the dielectric masks 106, 108, and the thicknesses of the dielectric spacers 112, 114. On the other hand, the average thickness of the implantation ion layer 118 is determined by the implantation dose. In this manner, by adjusting the implantation energy level, the thicknesses of the dielectric masks 106, 108 and the dielectric spacers 112, 114, and the implantation dose, specific dimensions and locations of the implanted ion layer 118 can be readily controlled. Note that because the same implantation dose is used to form different portions of the implanted ion layer 118, layer 118 has a substantially uniform thickness throughout different portions thereof.

The ion implantation step as shown in FIG. 4F, which is referred to herein as the base ion implantation step, is typically carried out using an energy beam having an energy level of from about 60 KeV to about 200 KeV and an ion dose from about $5.0 \times 10^{16}$ cm$^{-2}$ to about $5.0 \times 10^{18}$ cm$^{-2}$ at a temperature ranging from about 20° C. to about 800° C. Preferably, the ion implantation step is carried out using an energy beam having an energy level of from about 100 KeV to about 150 KeV and an ion dose from about $2.0 \times 10^{17}$ cm$^{-2}$ to about $2.0 \times 10^{18}$ cm$^{-2}$ at a temperature ranging from about 20° C. to about 600° C. If desired, the base ion implantation step may be followed by one or more supplemental ion implantation steps (not shown), which are carried over the same structure but under different implantation conditions, to form a high quality implanted ion layer 118.

Next, the entire structure is annealed at a sufficiently high temperature to convert the implanted oxygen and/or nitrogen ions into buried insulator material(s) such as, for example, oxides, nitrides, or oxynitrides.

The annealing is typically carried out at a temperature above 1250° C., and more typically at a temperature ranging from about 1300° C. to about 1350° C. Duration of annealing typically ranges from about 1 hour to about 100 hours, with a duration of from about 2 hours to about 24 hours being more typical. Preferably, the annealing is carried out in an oxidizing ambient that includes from about 0.1% to about 100% oxygen (by total volume) and from about 99.9% to about 0% inert gas such as He, Ar, and $N_2$. In one preferred embodiment, Ar is employed as the inert gas. More preferably, the annealing step of the present invention is carried out in an oxidizing ambient that includes from about 0.1% to about 50% oxygen (by total volume) and from about 50% to about 99.9% inert gas.

The annealing step may be carried out by simply heating the substrate at a specific temperature ramp rate to the targeted annealing temperature, or various ramp and soak cycles may be employed. During the various ramp and soak cycles, it is possible to vary the content of the annealing ambient within the ranges mentioned hereinabove.

Figure 4G:
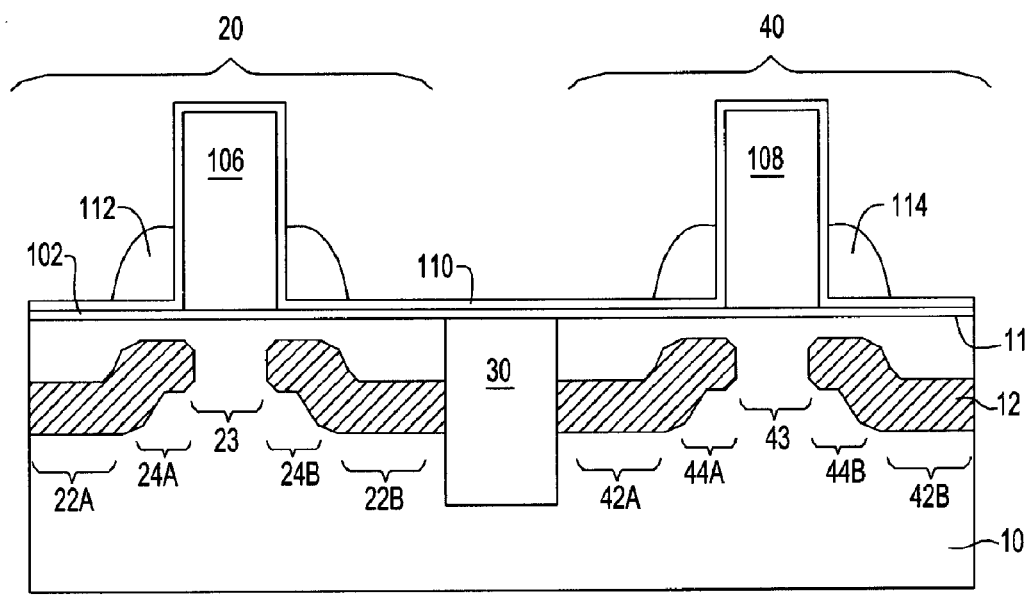

As a result, the implanted ion layer 118 is converted into the patterned buried insulator layer 12, as shown in FIG. 4G. The patterned buried insulator layer 12 so formed has a substantially uniform thickness throughout the S/D regions 22A, 22B, 42A, and 42B and the S/D extension regions 24A, 24B, 44A, and 44B, because a single ion implantation step with a single ion dose is used to form the implanted ion layer 118, which has a substantially uniform thickness throughout.

Subsequently, the selectively etchable layer 110, the dielectric masks 106 and 108, and the dielectric spacers 112 and 114 can be removed, followed by a convention replacement gate process to form gate dielectrics 26, 46 and gate electrodes 28, 48, as shown in FIG. 1.

FIGS. 5A-5F show exemplary processing steps for forming the SOI device of FIG. 1 by using a single ion implantation step without the replacement gate step, according to one embodiment of the present invention.

Figure 5A:
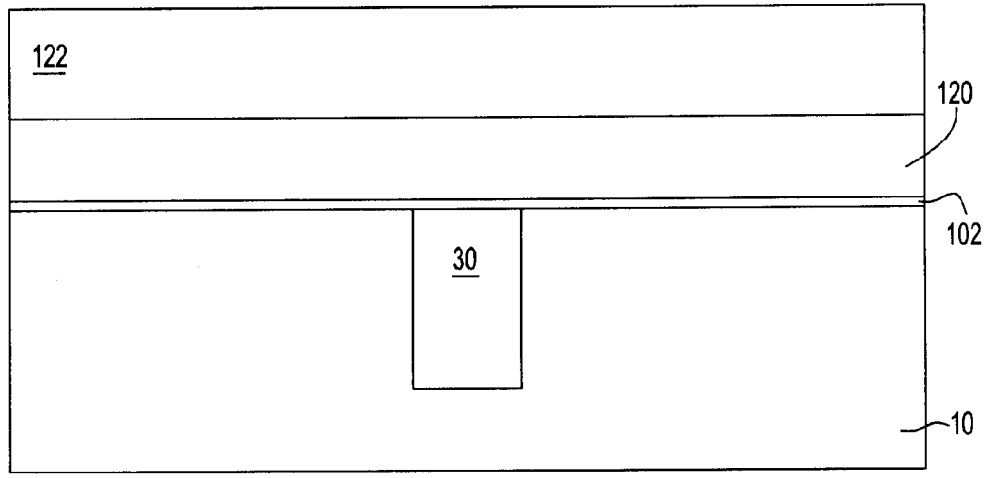
FIGS. 5A-5F show exemplary processing steps for forming the SOI device of FIG. 1 by using a single ion implantation step without the replacement gate step, according to one embodiment of the present invention.

Specifically, a blanket gate conductor layer 120 and a dielectric cap layer 122 (instead of a single blanket dielectric mask layer 104) are formed on an upper surface of the thin dielectric layer 102, as shown in FIG. 5A.

The blanket gate conductor layer 120 may comprise any suitable conductive materials that can be used for forming the gate electrodes of the FETs 20 and 40. For example, the blanket gate conductor layer 120 may comprise metal, metal alloy, metal nitride, metal silicide, or a semiconductor material such as Si or SiGe alloy in polycrystalline or amorphous form. The blanket gate conductor layer 120 can be formed by any known deposition processes, such as, for example, CVD, PVD, ALD, evaporation, reactive sputtering, chemical solution deposition, etc. When the blanket gate conductor layer 120 comprises a semiconductor material, such a semiconductor material is preferably doped either in situ or after deposition. The thickness, i.e., height, of the blanket gate conductor layer 120 may vary depending on the deposition process used. Typically, the blanket gate conductor layer 120 has a vertical thickness from about 20 to about 180 nm, with a thickness from about 40 to about 150 nm being more typical.

The blanket dielectric cap layer 122 may comprise any suitable dielectric masking material(s), including, but not limited to: oxides, nitrides, and oxynitrides. Preferably, but not necessarily, the blanket dielectric cap layer 122 comprises silicon nitride. The physical thickness of the blanket dielectric cap layer 122 is adjusted so as to completely block implantation of oxygen and/or nitrogen ions into the substrate 10 and the gate conductor layer 120 during subsequent ion implantation step(s), and it therefore depends on the specific energy level of the implanted ions (which determines the ion implantation depth under normal conditions, i.e., when no masking structure is provided). Typically, the blanket dielectric cap layer 122 has a thickness ranging from about 100 nm to about 2000 nm, and more typically from about 400 nm to about 1200 nm.

Figure 5B:
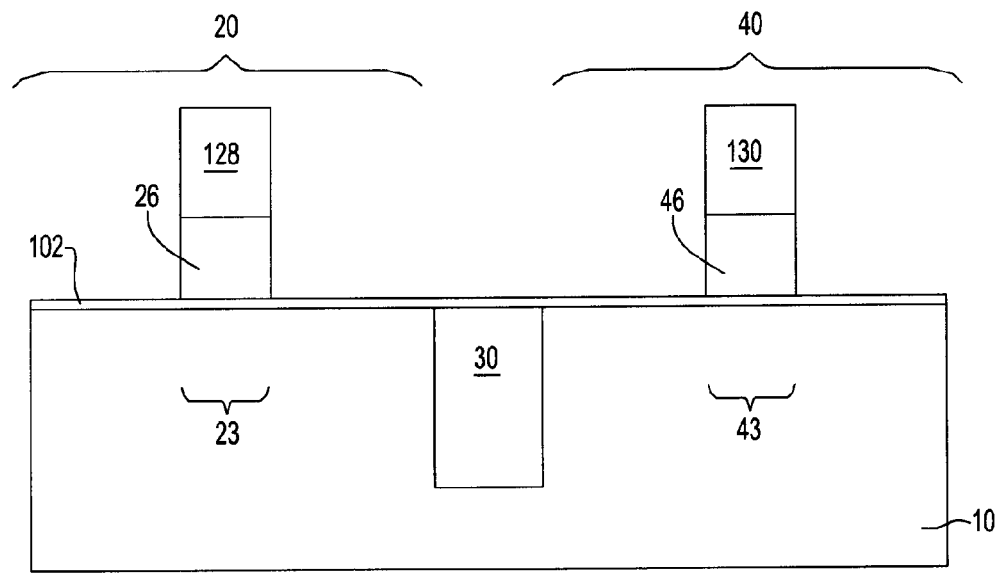

Next, the blanket dielectric cap layer 122 and the blanket gate conductor layer 120 are patterned into gate conductors 26, 46 and dielectric masks 128 and 130 for the FETs 20 and 40, as shown in FIG. 5B. The patterned gate conductors 26 and 46 and dielectric masks 106 and 108 specifically define channel regions 23 and 43 for the FETs 20 and 40.

Figure 5C:
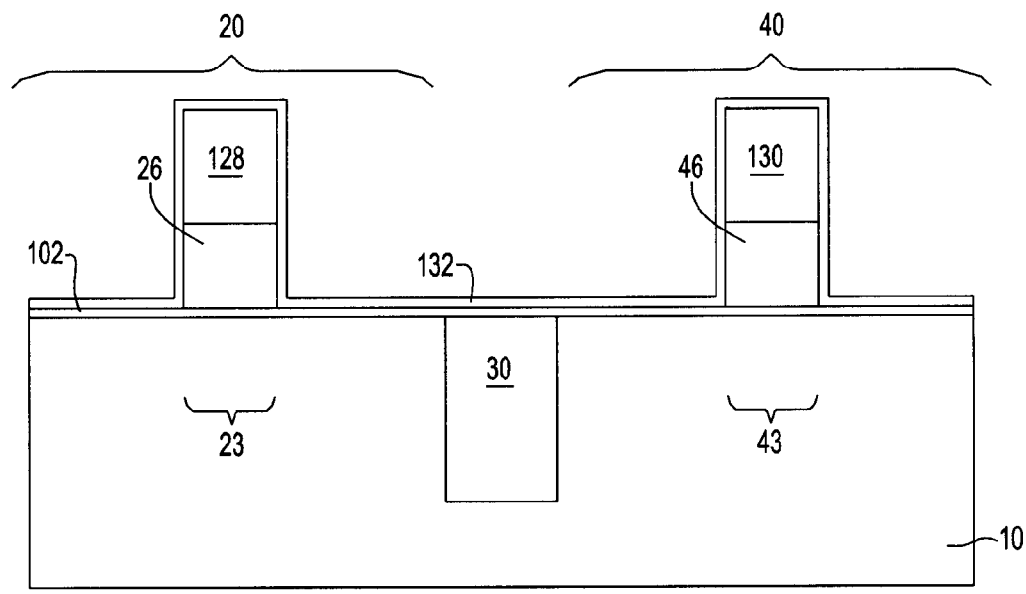
Figure 5D:
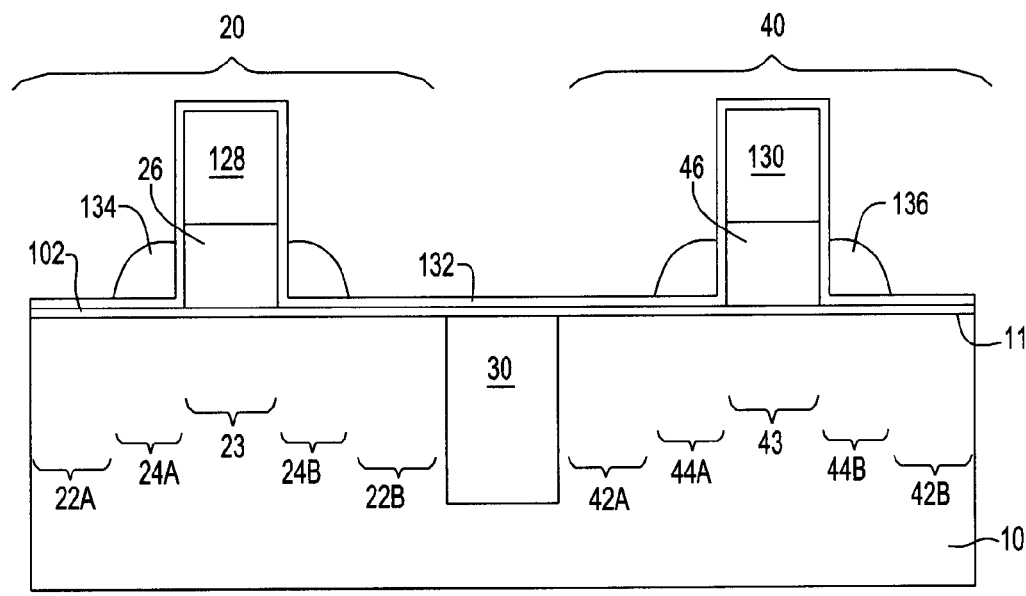

A selectively etchable layer 132, which is similar to layer 110 as described hereinabove, is formed over the entire structure, as shown in FIG. 5C. Subsequently, dielectric spacers 134 and 136, which are similar to spacers 112 and 114 as described hereinabove, are formed along sidewalls of the patterned gate conductors 26 and 46, thereby defining S/D extension regions 24A, 24B, 44A, and 44B (which are regions located directly under the dielectric spacers 134 and 136) as well as S/D regions 22A, 22B, 42A, and 42B (which are regions located neither under the spacers 134 and 136 nor under the gate conductors 26 and 46), as shown in FIG. 5D.

Figure 5E:
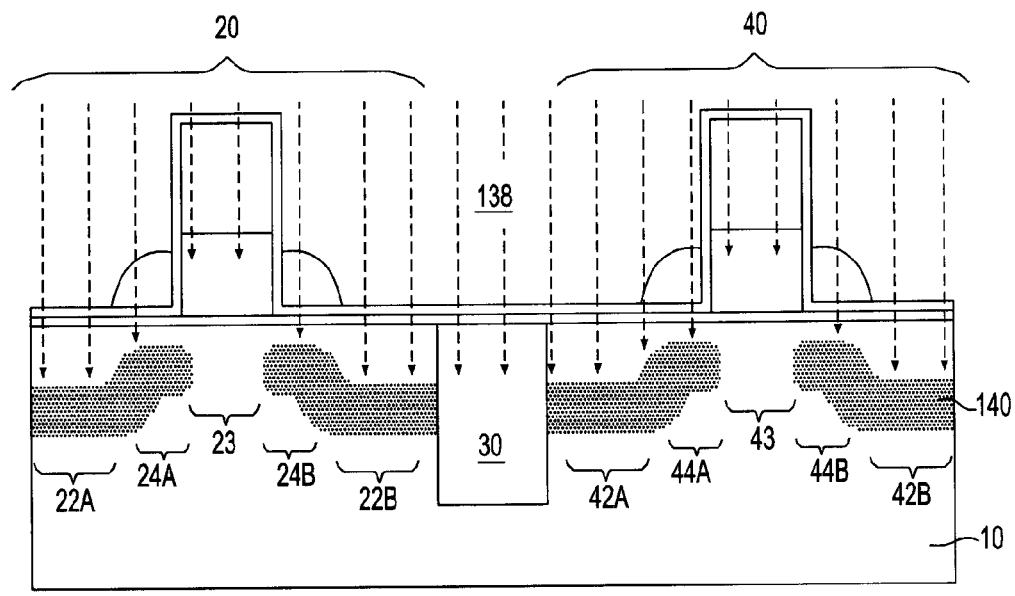

After formation of the dielectric spacers 134 and 136, a single ion implantation step is carried out to implant oxygen and/or nitrogen ions 138 into the S/D regions 22A, 22B, 42A, and 42B and the S/D extension regions 24A, 24B, 44A, and 44B, but not the channel regions 23 and 33, as shown in FIG. 5E. Consequently, a discontinuous implanted ion layer 140, which is similar to layer 118 as described hereinabove, is formed in the substrate 10.

During the single ion implantation step shown by FIG. 5E, the S/D regions 22A, 22B, 42A, and 42B are exposed without any masking structures thereon. Therefore, oxygen and/or nitrogen ions 138 are implanted into the S/D regions 22A, 22B, 42A, and 42B without obstruction, and the portions of the implanted ion layer 140 in the S/D regions 22A, 22B, 42A, and 42B are located at a first depth ($D_1$) that are determined solely by the ion implantation energy level. The S/D extension regions 24A, 24B, 44A, and 44B are covered by the dielectric spacers 134 and 136. Therefore, the implantation depth of oxygen and/or nitrogen ions 138 is significantly reduced in the S/D extension regions 24A, 24B, 44A, and 44B, and consequently, the portions of the implanted ion layer 140 in the S/D extension regions 24A, 24B, 44A, and 44B are located at a second, reduced depth ($D_2$). The channel regions 23 and 43 as well as the patterned gate electrodes 26 and 46 are covered by the dielectric masks 128 and 130 during the single implantation step of FIG. 5E. Therefore, implantation of oxygen and/or nitrogen ions 138 is completely blocked by the dielectric masks 128 and 130, and consequently, no oxygen or nitrogen ions are implanted into the channel regions 23 and 43 or the patterned gate electrodes 26 and 46. Note that $D_1$ and $D_2$ as discussed in this specific embodiment are the same as those shown previously in FIG. 1.

Next, the entire structure is annealed at a sufficiently high temperature to convert the implanted oxygen and/or nitrogen ions into buried insulator material(s) such as, for example, oxides, nitrides, or oxynitrides.

Figure 5F:
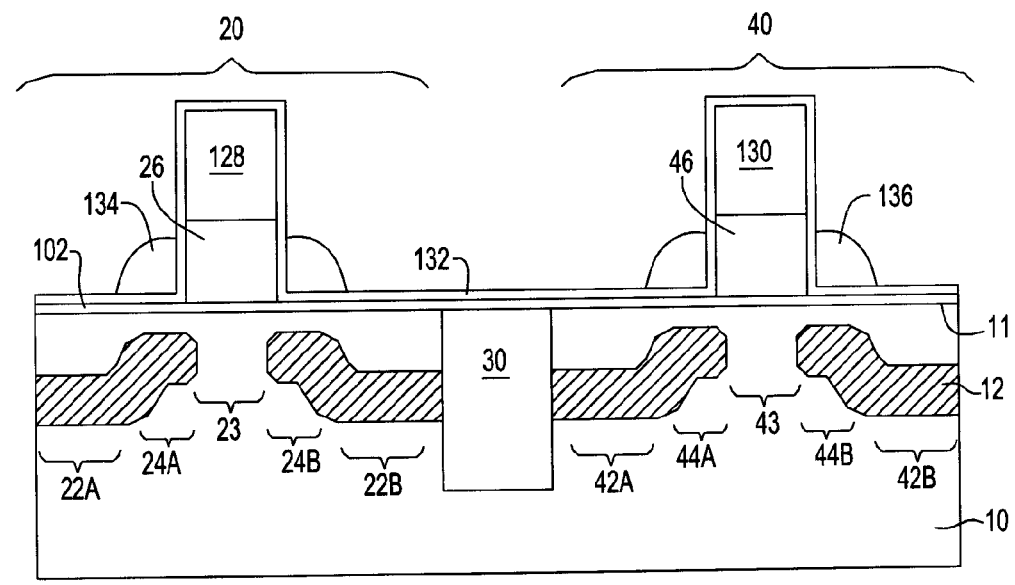

As a result, the implanted ion layer 140 is converted by the annealing step into the patterned buried insulator layer 12, as shown in FIG. 5F. The patterned buried insulator layer 12 so formed has a substantially uniform thickness throughout the S/D regions 22A, 22B, 42A, and 42B and the S/D extension regions 24A, 24B, 44A, and 44B, because a single ion implantation step with a single ion dose is used to form the implanted ion layer 140, which has a substantially uniform thickness throughout.

Subsequently, the selectively etchable layer 132, the dielectric masks 128 and 130, and the dielectric spacers 134 and 136 can be removed. The thin dielectric layer 102 can be patterned into gate dielectrics 26 and 46 using the patterned gate electrodes 26 and 46 as masks, thereby forming the device structure as shown in FIG. 1. Note that the embodiment as shown in FIGS. 5A-5G does not require a replacement gate process.

FIGS. 6A-6F show exemplary processing steps for forming the SOI device of FIG. 1 by using high-density plasma (HDP) oxide masks during the single ion implantation step, according to one embodiment of the present invention.

Figure 6A:
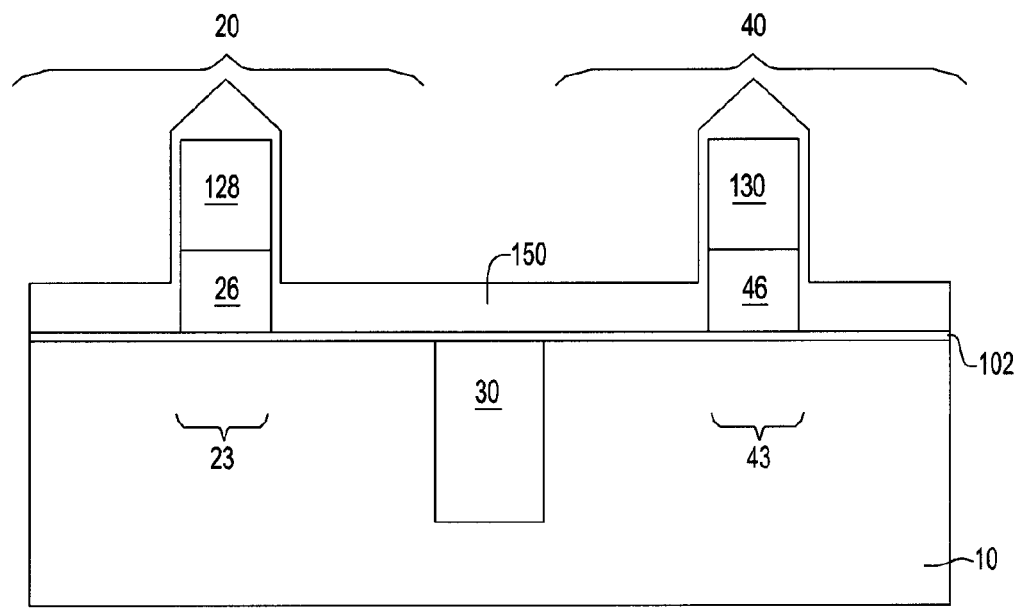
FIGS. 6A-6F show exemplary processing steps for forming the SOI device of FIG. 1 by using high-density plasma (HDP) oxide masks during the single ion implantation step, according to one embodiment of the present invention.

Specifically, after formation of the patterned gate conductors 26, 46 and the dielectric masks 128 and 130 for the FETs 20 and 40 (as shown in FIG. 5B), an oxide layer 150 is deposited over the entire structure by a high-density plasma (HDP) deposition process, as shown in FIG. 6A. The high-density plasma (HDP) deposition process is anisotropic, i.e., it deposits over a horizontal surface at a significantly faster rate than that over a vertical surface. Consequently, the oxide layer 150 so deposited can achieve sufficient layer thickness over the horizontal upper surface of the thin dielectric layer 102, with little or no accumulation over sidewalls of the patterned dielectric masks 128 and 130 and the gate electrodes 26 and 46.

The thickness of the HDP oxide layer 150 is adjusted in order to reduce the implantation depth of oxygen and/or nitrogen ions in subsequent ion implantation step(s) from the normal ion implantation depth ($D_1$) to a predetermined, reduced depth ($D_2$). Therefore, the thickness of the HDP oxide layer 150 depends not only on the specific energy level of the implanted ions (which determines the normal ion implantation depth $D_1$), but also on the predetermined, reduced depth $D_2$. Typically, the HDP oxide layer 150 has an average thickness ranging from about 20 nm to about 300 nm, and more typically from about 30 nm to about 150 nm.

Unlike the dielectric spacers 112, 114, 134, and 136, the thickness of the HDP oxide layer 150 is adjusted by the HDP deposition process, not by an etching process. The HDP deposition process allows more precise thickness control, in comparison with the etching process.

Figure 6B:
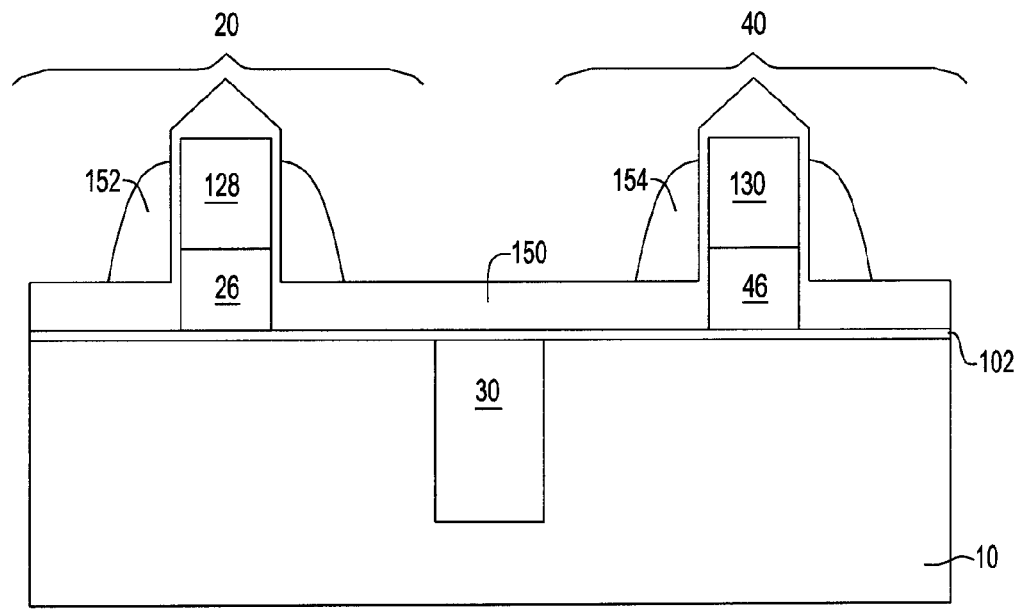
Figure 6C:
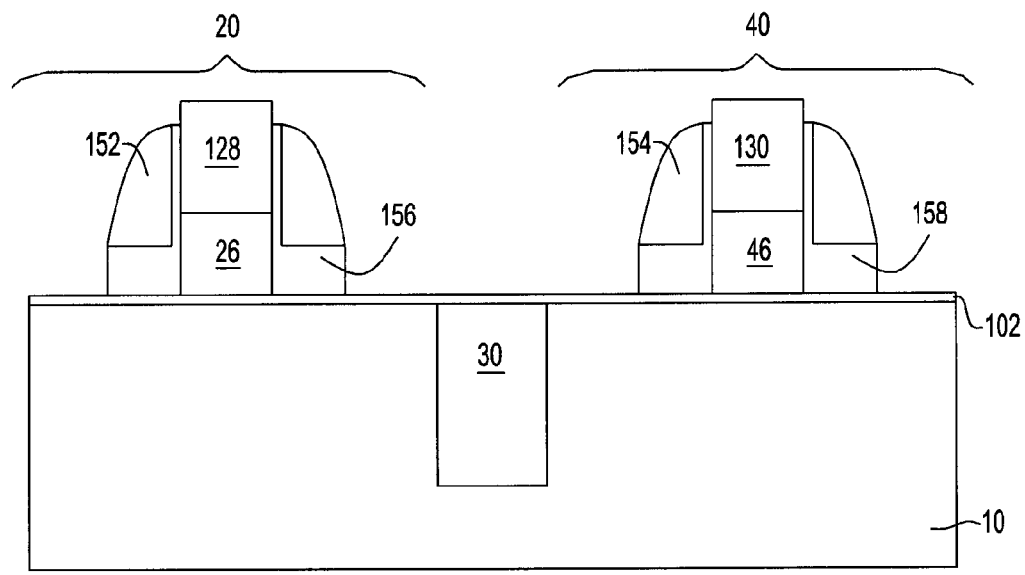

Sacrificial spacers 152 and 154 are formed as masks for selective etching of the HDP oxide layer 150, thereby forming HDP oxide spacers 156 and 158, as shown in FIGS. 6B-6C. The sacrificial spacers 152 and 154 may comprise any suitable material against which the HDP oxide layer 150 can be selectively etched. In a preferred, but not necessary, embodiment of the present invention, sacrificial spacers 152 and 154 comprises polysilicon, so that the HDP oxide layer can be selectively etched by a RIE process. After formation of the HDP oxide spacers 156 and 158, the sacrificial spacers 152 and 154 are removed, thereby exposing the HDP oxide spacers 156 and 158, as shown in FIG. 6D.

Figure 6D:
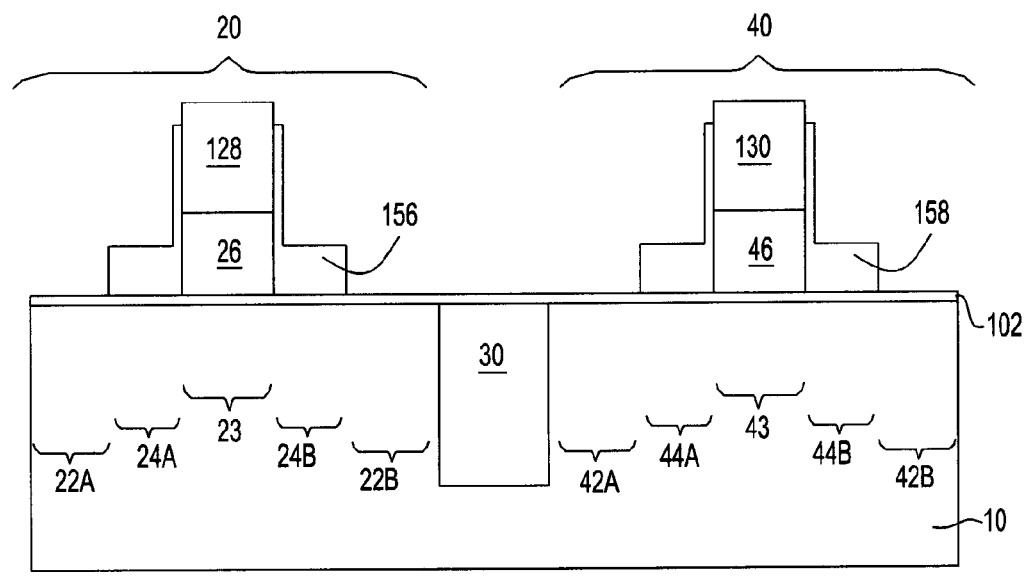

The HDP oxide spacers 156 and 158 so formed define S/D extension regions 24A, 24B, 44A, and 44B (which are regions located directly under the spacers 156 and 158) and S/D regions 22A, 22B, 42A, and 42B (which are regions located neither under the spacers 156 and 158 nor under the gate conductors 26 and 46), as shown in FIG. 6D.

Figure 6E:
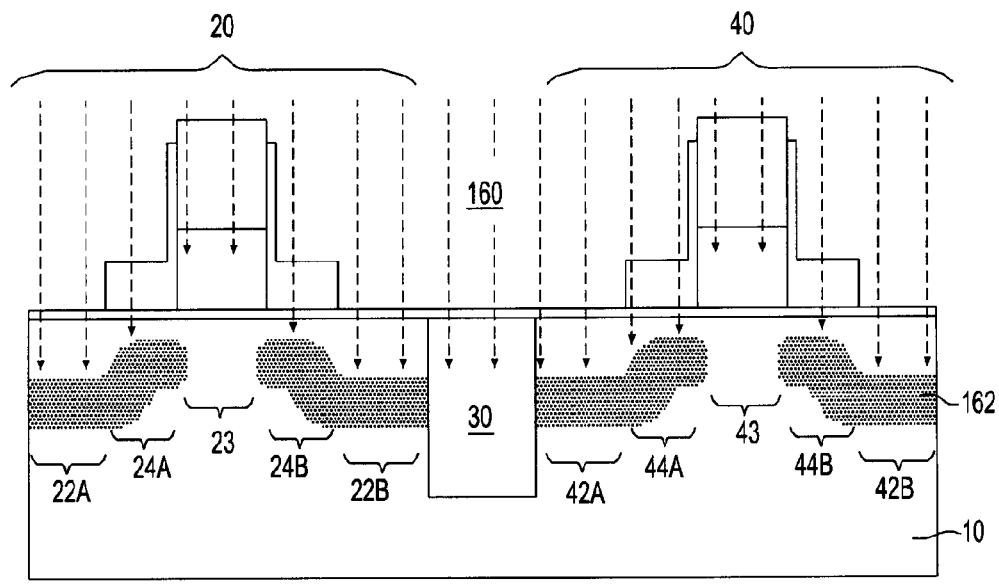

After formation of the HDP oxide spacers 156 and 158, a single ion implantation step is carried out to implant oxygen and/or nitrogen ions 160 into the S/D regions 22A, 22B, 42A, and 42B and the S/D extension regions 24A, 24B, 44A, and 44B, but not the channel regions 23 and 33, as shown in FIG. 6E. Consequently, a discontinuous implanted ion layer 162, which is similar to layers 118 and 140 as described hereinabove, is formed in the substrate 10.

During the single ion implantation step shown by FIG. 6E, the S/D regions 22A, 22B, 42A, and 42B are exposed without any masking structures thereon. Therefore, oxygen and/or nitrogen ions 160 are implanted into the S/D regions 22A, 22B, 42A, and 42B without obstruction, and the portions of the implanted ion layer 162 in the S/D regions 22A, 22B, 42A, and 42B are located at a first depth ($D_1$) that are determined solely by the ion implantation energy level. The S/D extension regions 24A, 24B, 44A, and 44B are covered by the HDP oxide spacers 156 and 158. Therefore, the implantation depth of oxygen and/or nitrogen ions 162 is significantly reduced in the S/D extension regions 24A, 24B, 44A, and 44B, and consequently, the portions of the implanted ion layer 162 in the S/D extension regions 24A, 24B, 44A, and 44B are located at a second, reduced depth ($D_2$). The channel regions 23 and 43 as well as the patterned gate electrodes 26 and 46 are covered by the dielectric masks 128 and 130 during the single implantation step of FIG. 6E. Therefore, implantation of oxygen and/or nitrogen ions 160 is completely blocked by the dielectric masks 128 and 130, and consequently, no oxygen or nitrogen ions are implanted into the channel regions 23 and 43 or the patterned gate electrodes 26 and 46. Note that $D_1$ and $D_2$ as discussed in this specific embodiment are the same as those shown previously in FIG. 3.

Figure 6F:
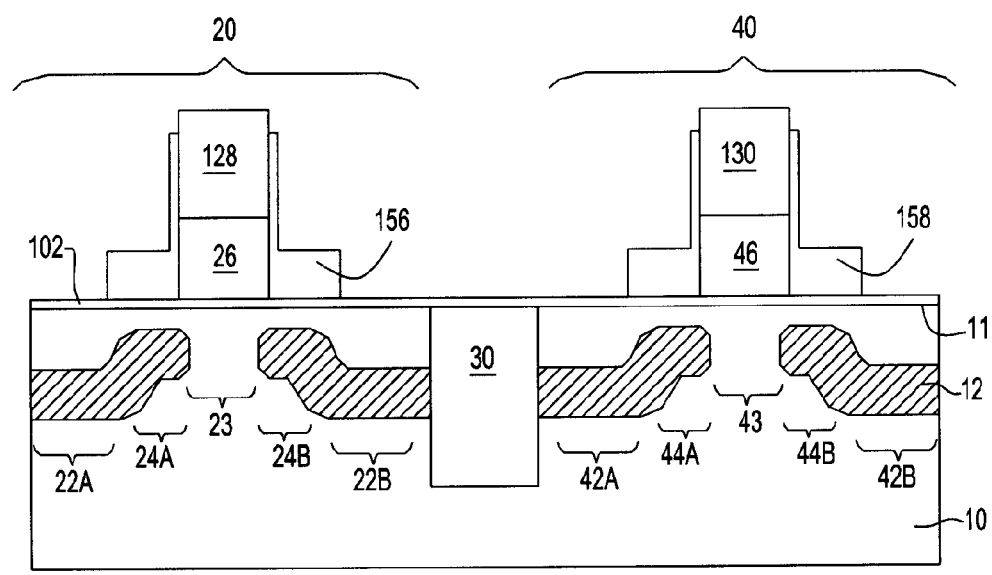

Next, the entire structure is annealed at a sufficiently high temperature to convert the implanted oxygen and/or nitrogen ions into buried insulator material(s). As a result, the implanted ion layer 162 is converted into the patterned buried insulator layer 12, as shown in FIG. 6F. The patterned buried insulator layer 12 so formed has a substantially uniform thickness throughout the S/D regions 22A, 22B, 42A, and 42B and the S/D extension regions 24A, 24B, 44A, and 44B.

Subsequently, the dielectric masks 128 and 130 and the HDP oxide spacers 156 and 158 can be removed. The thin dielectric layer 102 can be patterned into gate dielectrics 26 and 46 using the patterned gate electrodes 26 and 46 as masks, thereby forming the device structure as shown in FIG. 1.

FIGS. 7A-7F show exemplary processing steps for forming the SOI device of FIG. 2 by using two ion implantation steps, one for S/D ion implantation and the other for S/D extension ion implantation, according to one embodiment of the present invention.

Figure 7A:
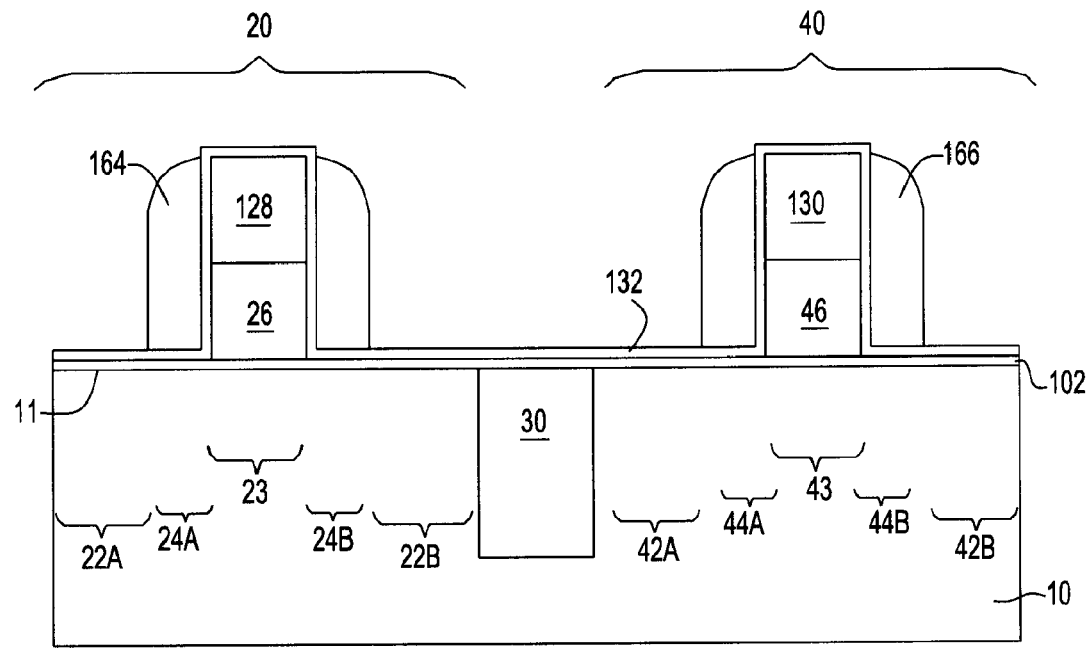
FIGS. 7A-7F show exemplary processing steps for forming the SOI device of FIG. 2 by using two ion implantation steps, one for S/D oxygen and/or nitrogen ion implantation and the other for S/D extension oxygen and/or nitrogen ion implantation, according to one embodiment of the present invention.

Specifically, after formation of the selectively etchable layer 132 over the entire structure (as shown in FIG. 5C), dielectric spacers 164 and 166 are deposited over the sidewalls of the patterned dielectric masks 128 and 130 and the gate electrodes 26 and 46 to thereby define S/D extension regions 24A, 24B, 44A, and 44B (which are regions located directly under the spacers 164 and 166) and S/D regions 22A, 22B, 42A, and 42B (which are regions located neither under the spacers 164 and 166, nor under the gate conductors 26 and 46), as shown in FIG. 7A.

The dielectric spacers 164 and 166 are similar to the above-described dielectric spacers 112, 114, 134, and 136, except that the dielectric spacers 164 and 166 have an average thickness that is significantly larger than that of the dielectric spacers 112, 114, 134, and 136. Specifically, the average thickness of the dielectric spacers 164 and 166 is adjusted in order to completely block implantation of oxygen and/or nitrogen ions into the S/D extension regions 24A, 24B, 44A, and 44B during subsequent ion implantation step(s). Therefore, the average thickness of the dielectric spacers 164 and 166 typically ranges from about 100 nm to about 2000 nm, and more typically from about 400 nm to about 1200 nm.

Figure 7B:
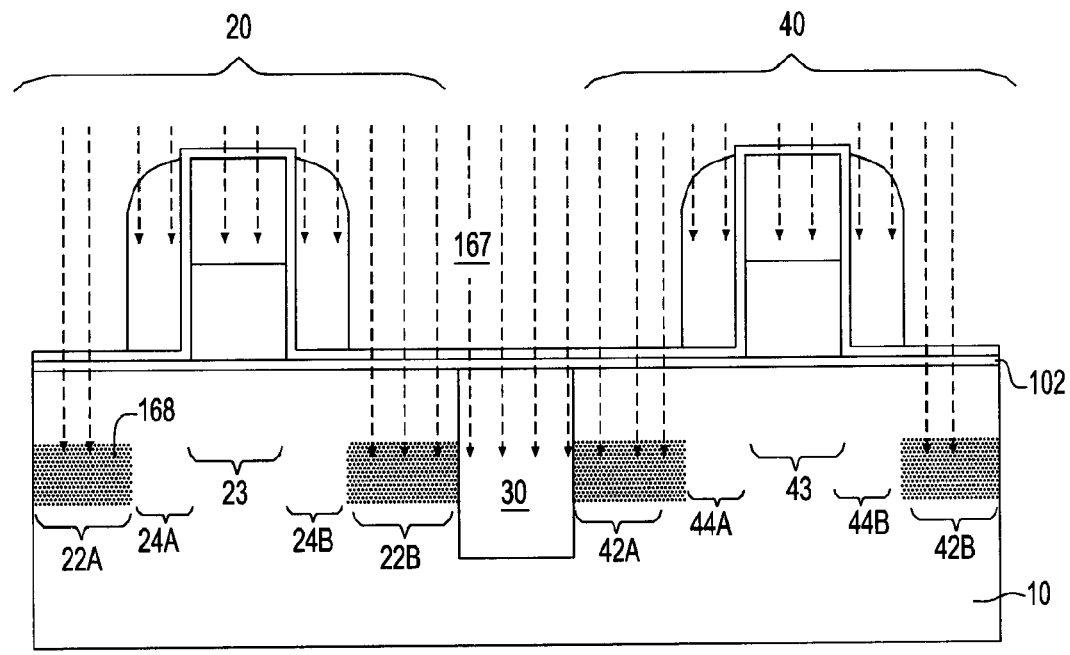

After formation of the dielectric spacers 164 and 166, a first ion implantation step is carried out to implant oxygen and/or nitrogen ions 167 into the S/D regions 22A, 22B, 42A, and 42B, but not the S/D extension regions 24A, 24B, 44A, and 44B and the channel regions 23 and 33, as shown in FIG. 7B. Consequently, first portions 168 of a discontinuous implanted ion layer are formed in the S/D regions 22A, 22B, 42A, and 42B of the substrate 10 at a first depth ($D_1$) with a first thickness ($T_1$). $D_1$ and $T_1$ can be readily controlled by adjusting the implantation energy level and the implantation dose of the first ion implantation step.

Figure 7C:
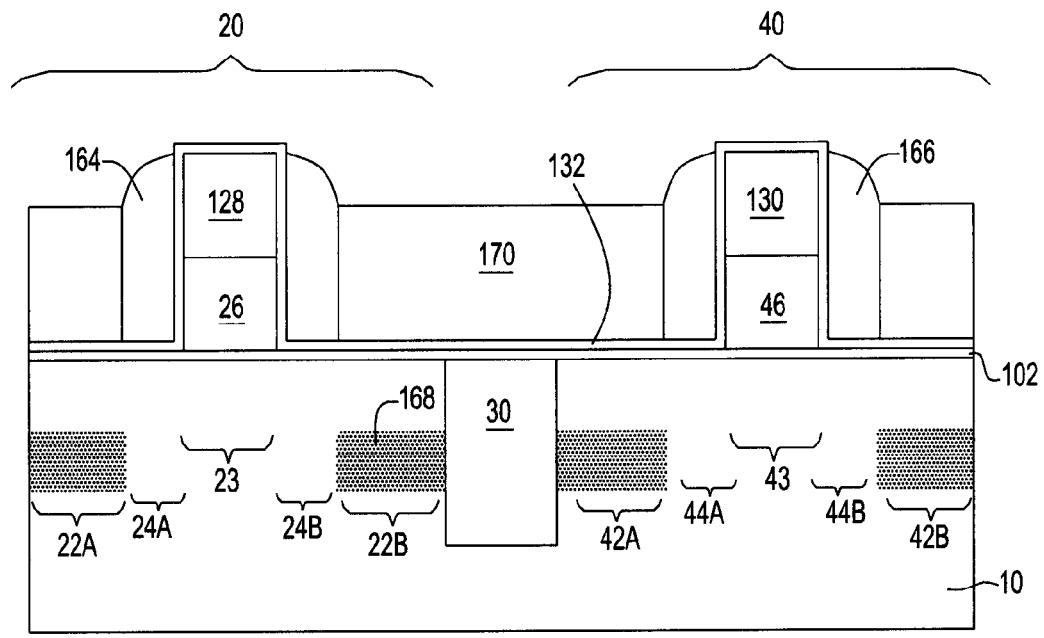
Figure 7D:
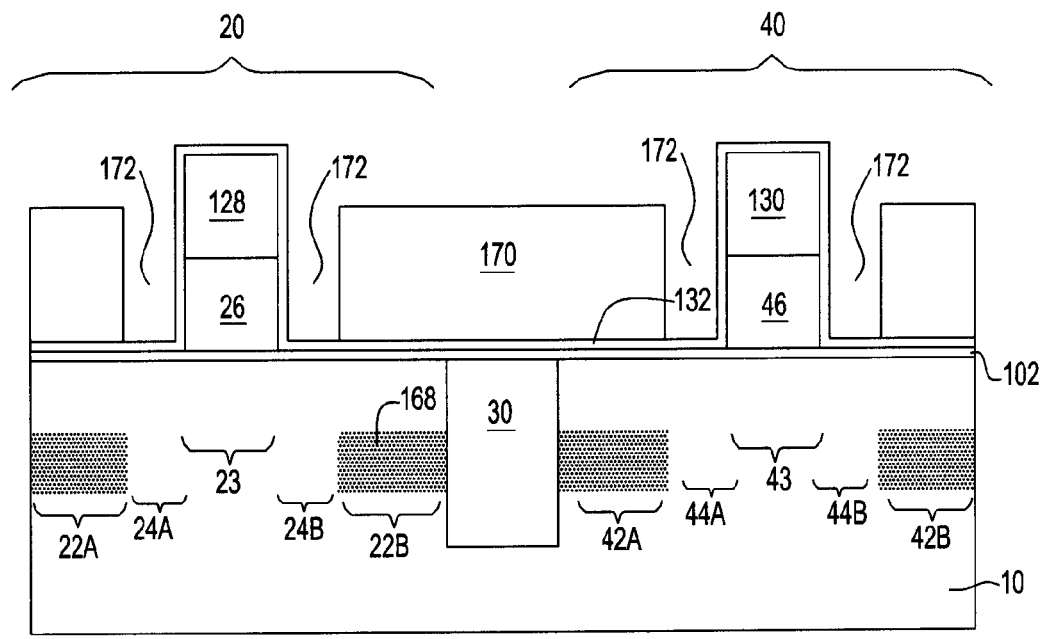

Next, a resist coating 170 is deposited over the entire structure, followed by chemical vapor deposition and recess etching to expose the dielectric spacers 164 and 166, as shown in FIG. 7C. The dielectric spacers 164 and 166 are then selectively removed against the resist coating 170 and the selectively etchable layer 132, thereby forming trenches 172 directly above the S/D extension regions 24A, 24B, 44A, and 44B, as shown in FIG. 7D.

Figure 7E:
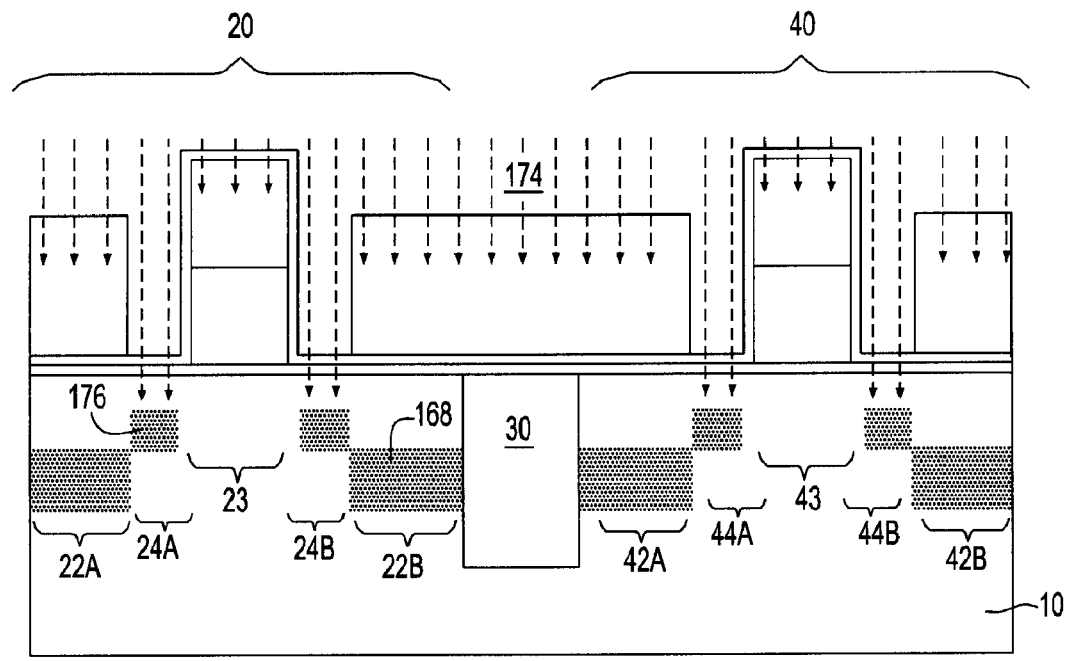

A second ion implantation step is then carried out to implant oxygen and/or nitrogen ions 174 into the S/D extension regions 24A, 24B, 44A, and 44B, but not the S/D regions 22A, 22B, 42A, and 42B and the channel regions 23 and 33, as shown in FIG. 7E. Consequently, second portions 176 of the discontinuous implanted ion layer are formed in the S/D extension regions 24A, 24B, 44A, and 44B of the substrate 10 at a second depth ($D_2$) with a second thickness ($T_2$). $D_2$ and $T_2$ are independently controlled by adjusting the implantation energy level and the implantation dose of the second ion implantation step. Typically, $D_2$ is smaller than $D_1$, as described hereinabove. On the other hand, $T_2$ can be larger than, smaller than, or substantially the same as $T_1$, although in the specific embodiment shown by FIG. 7E, $T_2$ is significantly smaller than $T_1$. Note that $D_1$, $D_2$, $T_1$, and $T_2$ as discussed herein are the same as those shown previously in FIG. 2.

Figure 7F:
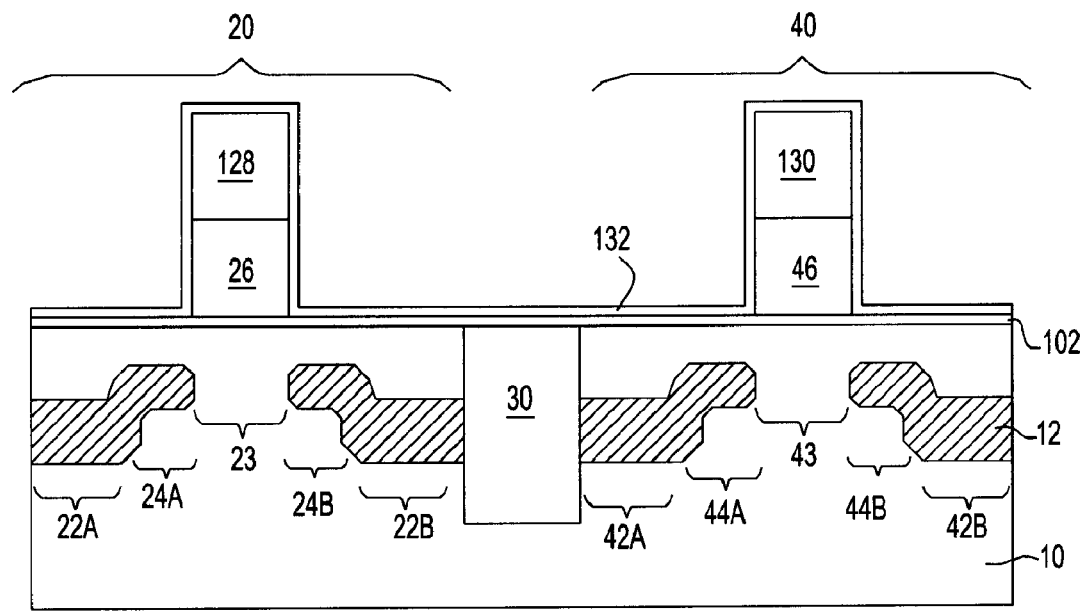

Next, the entire structure is annealed at a sufficiently high temperature to convert the implanted oxygen and/or nitrogen ions into buried insulator material(s). As a result, the implanted ion layer containing the first portions 168 and the second portions 176 is converted by the annealing step into the patterned buried insulator layer 12, as shown in FIG. 7F. The patterned buried insulator layer 12 so formed has a significantly larger thickness in the S/D regions 22A, 22B, 42A, and 42B than in the S/D extension regions 24A, 24B, 44A, and 44B, because two separate ion implantation steps with two different ion doses are independently used to form the first portions 168 and the second portions 176 of the implanted ion layer.

Subsequently, the resist coating 170, the dielectric masks 128 and 130, and the selectively etchable layer 132 are removed. The thin dielectric layer 102 can be patterned into gate dielectrics 26 and 46 using the patterned gate electrodes 26 and 46 as masks, thereby forming the device structure as shown in FIG. 2.

FIGS. 8A-8G show exemplary processing steps for forming the SOI device of FIG. 3 by using two ion implantation steps, one of which implants oxygen and/or nitrogen ions in both the S/D and the extension regions, and the other of which implants oxygen and/or nitrogen ions only in the extension regions, according to one embodiment of the present invention.

Figure 8A:
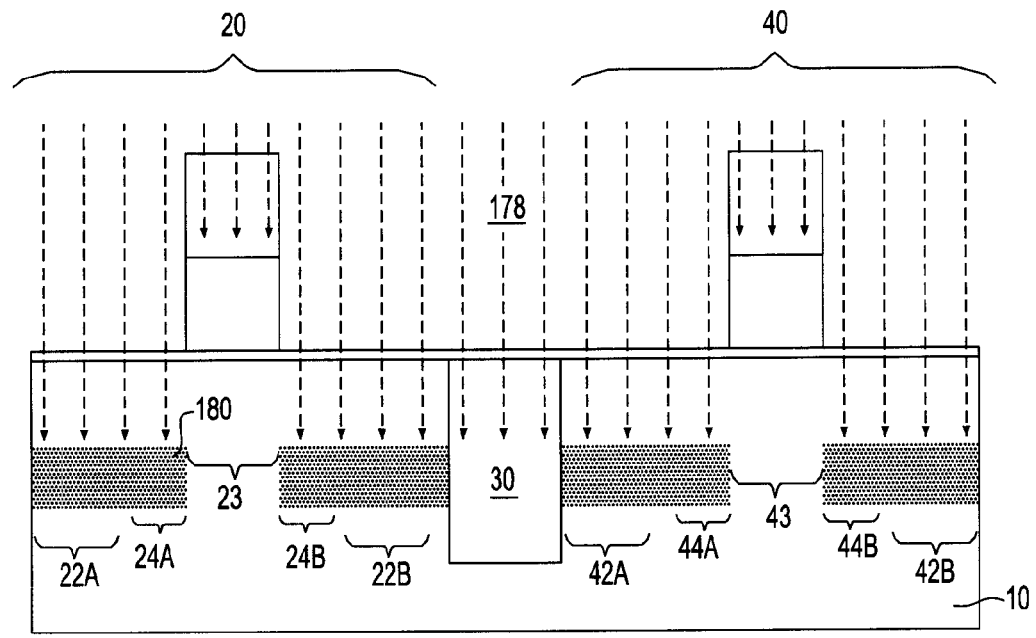
FIGS. 8A-8G show exemplary processing steps for forming the SOI device of FIG. 3 by using two ion implantation steps, one of which implants oxygen and/or nitrogen ions in both the S/D and the extension regions and the other of which implants oxygen and/or nitrogen ions only in the extension regions, according to one embodiment of the present invention.

Specifically, after formation of the patterned into gate conductors 26, 46 and dielectric masks 128 and 130 for the FETs 20 and 40 (as shown in FIG. 5B), a first ion implantation step is directly carried out to implant oxygen and/or nitrogen ions 178 into the S/D regions 22A, 22B, 42A, and 42B and the S/D extension regions 24A, 24B, 44A, and 44B, but not the channel regions 23 and 33, as shown in FIG. 8A. Consequently, first portions 180 of a discontinuous implanted ion layer are formed in the S/D regions 22A, 22B, 42A, and 42B and the S/D extension regions 24A, 24B, 44A, and 44B of the substrate 10 at a first depth ($D_1$) with a first thickness ($T_1$). $D_1$ and $T_1$ can be readily controlled by adjusting the implantation energy level and the implantation dose of the first ion implantation step.

Figure 8B:
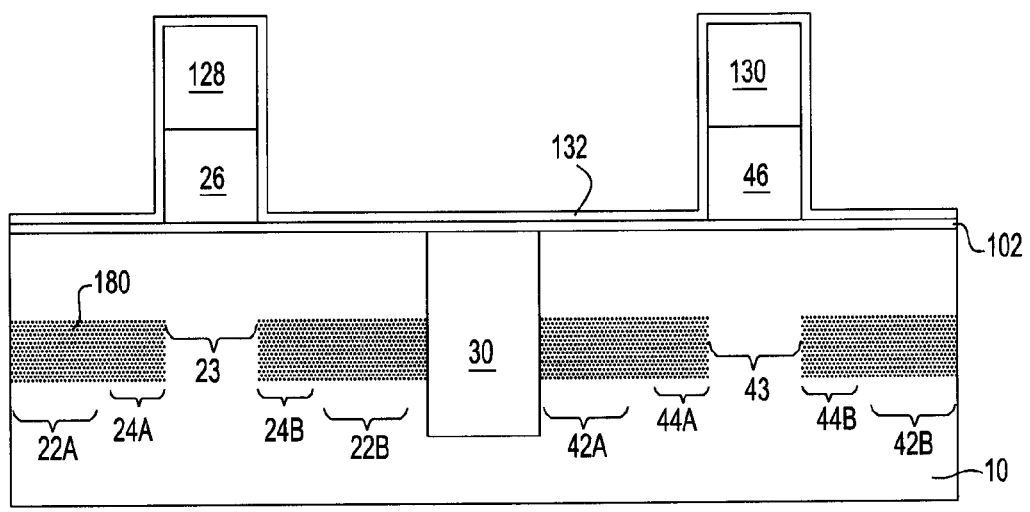
Figure 8C:
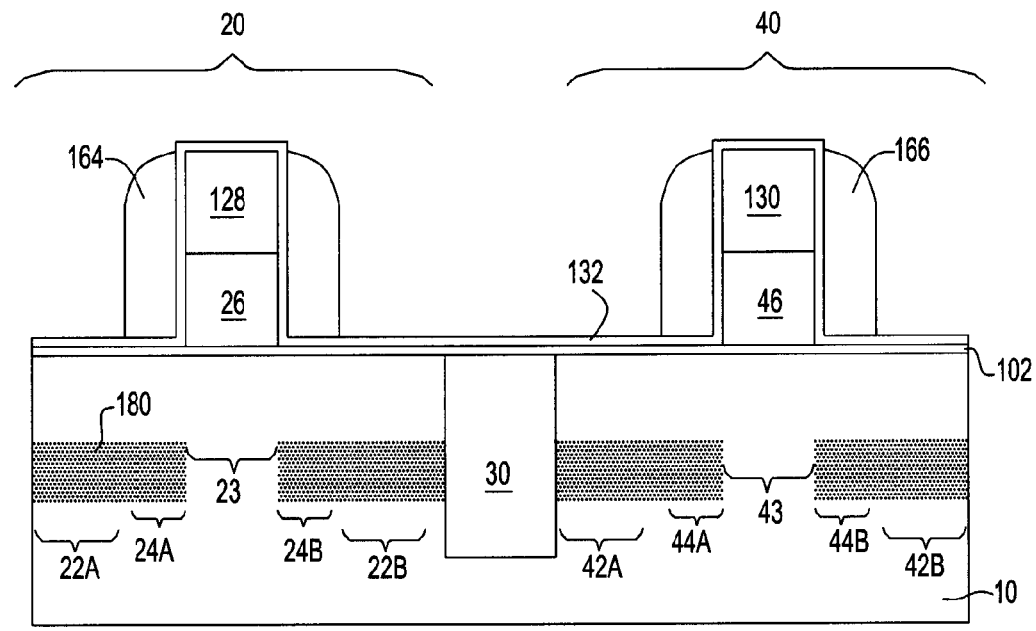

Next, a selectively etchable layer 132 as described hereinabove is formed over the entire structure, as shown in FIG. 8B. Subsequently, dielectric spacers 164 and 166 as described hereinabove are formed along sidewalls of the patterned dielectric masks 128 and 130 and the gate conductors 26 and 46, as shown in FIG. 8C.

Figure 8D:
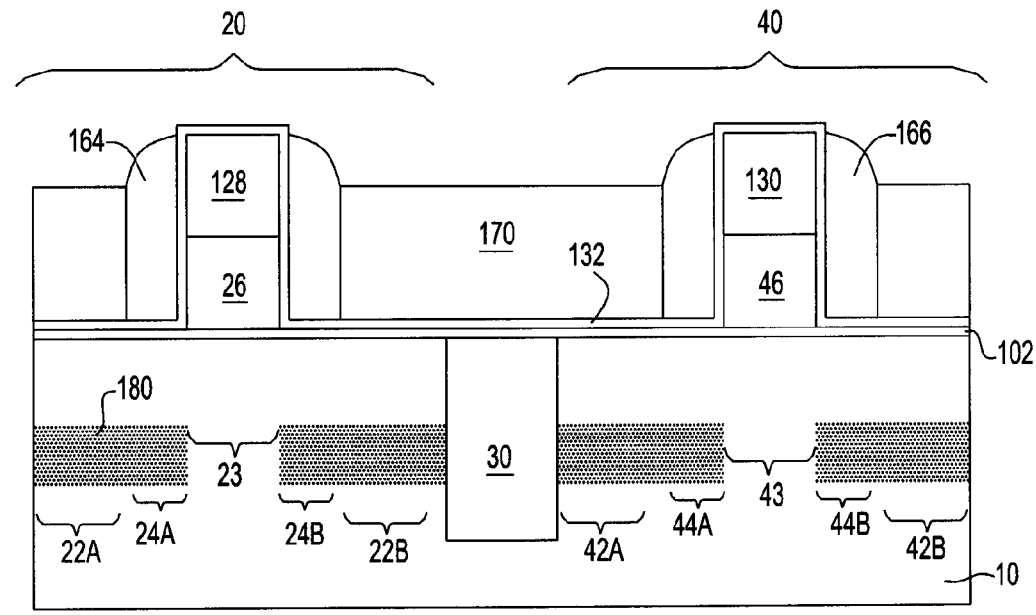
Figure 8E:
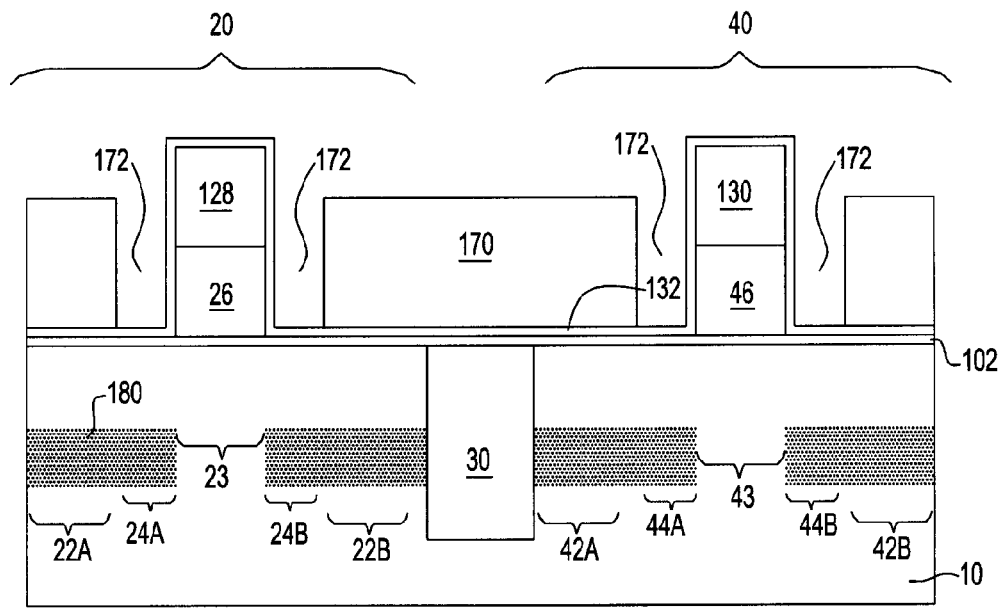

A resist coating 170 as described hereinabove is deposited over the entire structure, followed by chemical vapor deposition and recess etching to expose the dielectric spacers 164 and 166, as shown in FIG. 8D. The dielectric spacers 164 and 166 are then selectively removed against the resist coating 170 and the selectively etchable layer 132, thereby forming trenches 172 directly above the S/D extension regions 24A, 24B, 44A, and 44B, as shown in FIG. 8E.

Figure 8F:
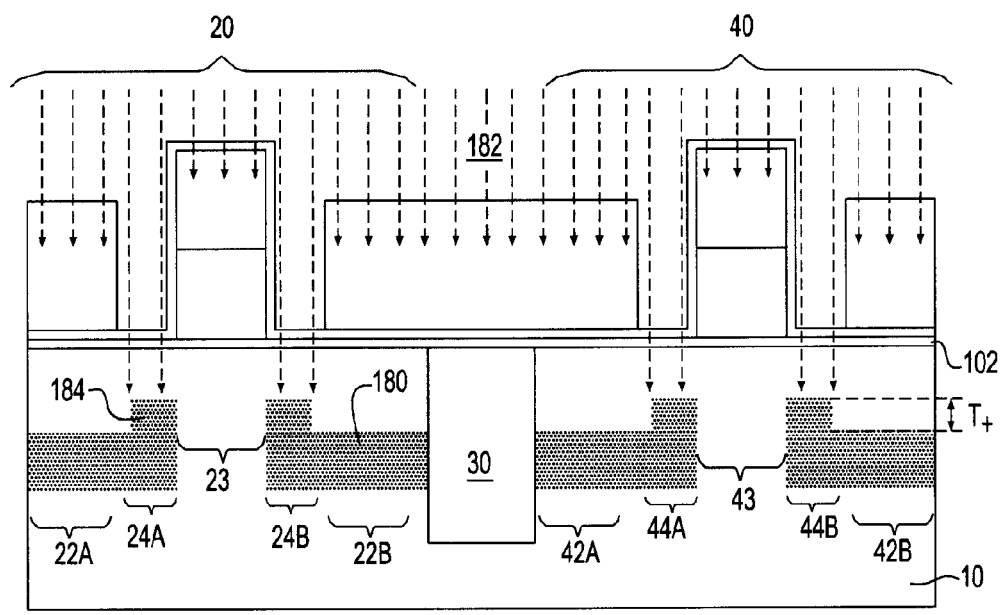

A second ion implantation step is then carried out to implant oxygen and/or nitrogen ions 182 into the S/D extension regions 24A, 24B, 44A, and 44B, but not the S/D regions 22A, 22B, 42A, and 42B and the channel regions 23 and 33, as shown in FIG. 8F. Consequently, second portions 184 of the discontinuous implanted ion layer are formed in the S/D extension regions 24A, 24B, 44A, and 44B of the substrate 10 at a second depth ($D_2$) with a second thickness ($T_+$). $D_2$ and $T_+$ are independently controlled by adjusting the implantation energy level and the implantation dose of the second ion implantation step. Typically, $D_2$ is smaller than $D_1$, as described hereinabove. On the other hand, $T_+$ can be larger than, smaller than, or substantially the same as $T_1$. Because the second portions 184 of the discontinuous implanted ion layer are formed directly over the first portions 180 in the S/D extension regions 24A, 24B, 44A, and 44B, the final thickness ($T_2$) of the discontinuous implanted ion layer in the S/D extension regions 24A, 24B, 44A, and 44B equals the sum of $T_1$ and $T_+$. Therefore, $T_2$ is larger than $T_1$ in this specific embodiment. Note that $D_1$, $D_2$, $T_1$, and $T_2$ as discussed herein are the same as those shown previously in FIG. 3.

Figure 8G:
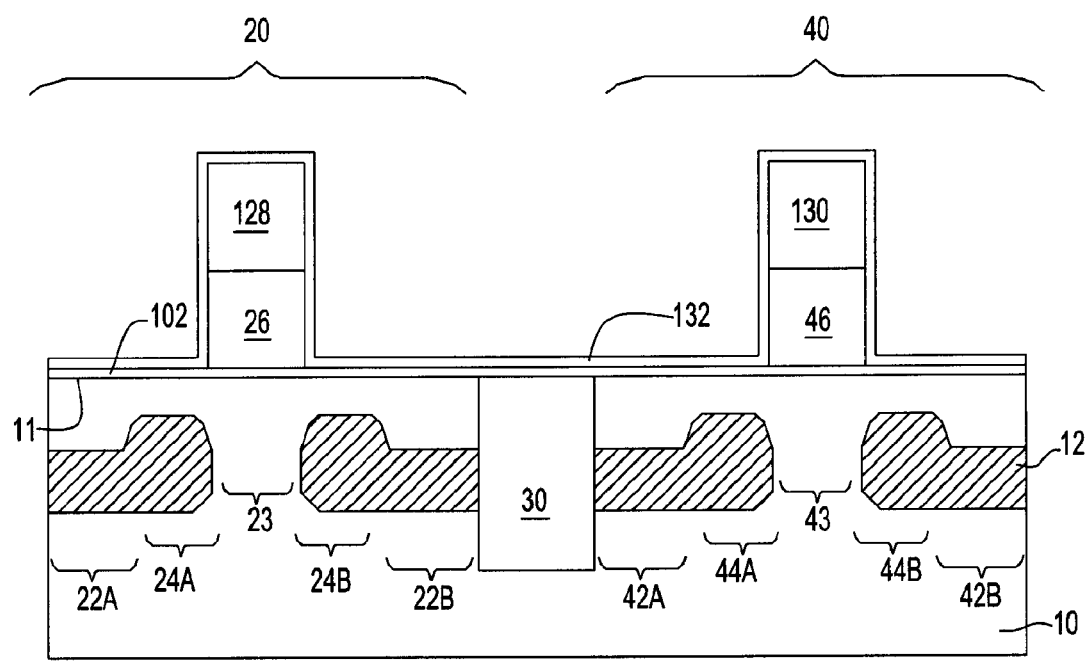

Next, the entire structure is annealed at a sufficiently high temperature to convert the implanted oxygen and/or nitrogen ions into buried insulator material(s). As a result, the implanted ion layer containing the first portions 180 and the second portions 184 is converted by the annealing step into the patterned buried insulator layer 12, as shown in FIG. 8G. The patterned buried insulator layer 12 so formed has a significantly larger thickness in the S/D extension regions 24A, 24B, 44A, and 44B than in the S/D regions 22A, 22B, 42A, and 42B.

Subsequently, the resist coating 170, the dielectric masks 128 and 130, and the selectively etchable layer 132 are removed. The thin dielectric layer 102 can be patterned into gate dielectrics 26 and 46 using the patterned gate electrodes 26 and 46 as masks, thereby forming the device structure as shown in FIG. 3.

While FIGS. 1-8G illustratively demonstrate several exemplary device structures and processing steps that can be used to form such device structures, according to specific embodiments of the present invention, it is clear that a person ordinarily skilled in the art can readily modify such device structures as well as the process steps for adaptation to specific application requirements, consistent with the above descriptions. For example, while the device structures shown in FIGS. 1-3 are designed as field effect transistors typically used in the CMOS technology, it is clear that a person ordinarily skilled in the art can readily modify the device structures of the present invention for use in other applications. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A method for forming a semiconductor-on-insulator (SOL) substrate comprising:

forming a semiconductor substrate having a substantially planar upper surface with first regions, second regions, and third regions;

forming a gate structure on the semiconductor surface overlying the first regions;

forming dielectric spacers abutting the gate structure and atop the second regions;

conducting a first ion implantation step following the forming of the dielectric spacers to selectively implant oxygen and/or nitrogen ions into the third regions of the semiconductor substrate, but not the first regions and the second regions of the semiconductor substrate;

forming a mask exposing the second regions of the semiconductor substrate; wherein forming the mask comprises forming a mask layer overlying the semiconductor substrate and removing the dielectric spacers to expose the second regions;

conducting a second ion implantation step to selectively implant oxygen and/or nitrogen ions into the second regions of the semiconductor substrate, but not the first regions and the third regions of the semiconductor substrate; and conducting one or more annealing steps to convert the implanted oxygen and/or nitrogen ions into a buried insulator, wherein the first regions of the semiconductor substrate do not contain any buried insulator, wherein the second regions of the semiconductor substrate contain first portions of a patterned buried insulator layer at a first depth from the substantially planar upper surface, wherein the third regions of the semiconductor substrate contain second portions of the patterned buried insulator layer at a second depth from the substantially planar upper surface, and wherein the first depth is greater than the second depth.

2. The method of claim 1, wherein the mask comprises dielectric block masks.

3. The method of claim 1, wherein the mask comprises oxide masks formed by a high-density plasma (HDP) process.

4. The method of claim 1, wherein the first ion implantation step implants the oxygen and/or nitrogen ions at the first depth from the substantially planar upper surface of the semiconductor substrate, and wherein the second ion implantation step implants the oxygen and/or nitrogen ions at the second depth from the substantially planar upper surface of the semiconductor substrate.

5. The method of claim 1, wherein the dielectric spacers have a thickness ranging from 100 nm to 2000 nm.

6. The method of claim 1, wherein the first ion implantation step implants oxygen and/or nitrogen ions into the source and drain regions, but not the source and drain extension regions.

7. The method of claim 6, wherein the mask is a resist coating, and the dielectric spacers are removed selective to the resist coating.

8. The method of claim 6, wherein the first depth ranges from 20 nm to 200 nm.

9. The method of claim 6, wherein the second depth ranges from 10 nm to 100 nm.

10. The method of claim 1, wherein the first and second portions of the patterned buried insulator layer have a thickness ranging from 10 nm to 200 nm.

11. The method of claim 1, wherein the first portions of the patterned buried insulator layer have a thickness ranging from 10 nm to 200 nm, and the second portions of the patterned buried insulator layer have a thickness ranging from 20 nm to 400 nm.

12. The method of claim 6 further comprising forming at least one of an n-channel FET and a p-channel FET.

13. The method of claim 6, wherein at least one of the first and second ion implantation step comprise an energy beam having an energy level ranging from 60 KeV to 200 KeV, and a dose ranging from $5.0 \times 10^{16}$ cm$^{-2}$ to $50 \times 10^{18}$ cm$^{-2}$.

14. The method of claim 6, wherein the one or more annealing steps comprise a temperature greater than 1250° C.

* * * * *